United States Patent
Yoshida et al.

(10) Patent No.: US 9,091,921 B2
(45) Date of Patent: Jul. 28, 2015

(54) LAYERED STRUCTURE AND PHOTOSENSITIVE DRY FILM TO BE USED THEREFOR

(75) Inventors: Takahiro Yoshida, Hiki-gun (JP); Shouji Minegishi, Hiki-gun (JP); Masao Arima, Hiki-gun (JP)

(73) Assignee: TAIYO HOLDINGS CO., LTD., Tokyo (JP)

(*) Notice: Subject to any disclaimer, the term of this patent is extended or adjusted under 35 U.S.C. 154(b) by 239 days.

(21) Appl. No.: 13/569,375

(22) Filed: Aug. 8, 2012

(65) Prior Publication Data

US 2012/0301824 A1 Nov. 29, 2012

Related U.S. Application Data

(63) Continuation of application No. PCT/JP2011/052001, filed on Feb. 1, 2011.

(30) Foreign Application Priority Data

Feb. 8, 2010 (JP) .................................. 2010-025955

(51) Int. Cl.
*G03F 7/004* (2006.01)
*G03F 7/095* (2006.01)
*H05K 3/28* (2006.01)

(52) U.S. Cl.
CPC .............. *G03F 7/095* (2013.01); *G03F 7/0047* (2013.01); *H05K 3/285* (2013.01); *H05K 2201/0209* (2013.01); *H05K 2201/0269* (2013.01); *H05K 2201/068* (2013.01)

(58) Field of Classification Search
None
See application file for complete search history.

(56) References Cited

U.S. PATENT DOCUMENTS

| 5,009,982 | A | 4/1991 | Kamayachi et al. | |
| 2003/0178229 | A1* | 9/2003 | Toyoda et al. | 174/261 |
| 2006/0062976 | A1* | 3/2006 | Sohn et al. | 428/209 |

(Continued)

FOREIGN PATENT DOCUMENTS

| CN | 101063814 A | 10/2007 |
| CN | 101105629 A | 1/2008 |

(Continued)

OTHER PUBLICATIONS

Machine translation JP 2008-304849. Dec. 18, 2008.*

(Continued)

*Primary Examiner* — Cynthia H Kelly
*Assistant Examiner* — Alyssa L Cepluch
(74) *Attorney, Agent, or Firm* — Oblon, McClelland, Maier & Neustadt, L.L.P.

(57) ABSTRACT

In a layered structure having at least a substrate and a photosensitive resin layer or cured film layer formed on the substrate and containing an inorganic filler, the content of the inorganic filler in the photosensitive resin layer or cured film layer is low on the side contacting the substrate and high on the surface side away from the substrate, so that a linear thermal expansion coefficient of the photosensitive resin layer or cured film layer as a whole is maintained as low as possible. Preferably, the inorganic filler content in the layer gradually increases continuously obliquely or stepwise from the side contacting the substrate to the surface side away from the substrate. A photosensitive dry film containing the above-mentioned photosensitive resin layer is suitable for use as a solder resist or an interlayer resin insulation layer of a printed wiring board.

4 Claims, 1 Drawing Sheet

(56) References Cited

U.S. PATENT DOCUMENTS

| | | |
|---|---|---|
| 2007/0238036 A1 | 10/2007 | Hayakawa et al. |
| 2010/0006324 A1* | 1/2010 | Kitamura et al. .............. 174/255 |
| 2010/0065314 A1* | 3/2010 | Lin et al. ........................ 174/258 |
| 2012/0125671 A1* | 5/2012 | Sato et al. ...................... 174/258 |

FOREIGN PATENT DOCUMENTS

| | | |
|---|---|---|
| CN | 101544784 A | 9/2009 |
| JP | 61-243869 | 10/1986 |
| JP | 10-207046 | 8/1998 |
| JP | 2007-294427 | 11/2007 |
| JP | 2008-304849 | 12/2008 |
| JP | 2009-076233 | 4/2009 |
| WO | WO 2010143507 A1 * | 12/2010 |

OTHER PUBLICATIONS

International Search Report issued Mar. 1, 2011 in PCT/JP2011/052001 filed Feb. 1, 2011.

Combined Office Action and Search Report issued Jul. 2, 2013 in Chinese Patent Application No. 201180008770.5 with partial English language translation.

U.S. Appl. No. 13/569,715, filed Aug. 8, 2012, Yoshida, et al.

* cited by examiner

LAYERED STRUCTURE AND PHOTOSENSITIVE DRY FILM TO BE USED THEREFOR

CROSS-REFERENCE TO RELATED APPLICATIONS

This is a continuation of Application PCT/JP2011/052001, filed Feb. 1, 2011, which was published under PCT Article 21(2).

BACKGROUND OF THE INVENTION

1. Field of the Invention

This invention relates to a layered structure, such as a printed wiring board or printed circuit board, and a photosensitive dry film to be used as a solder resist or an interlayer resin insulation layer thereof.

2. Description of Related Art

In recent years, in view of high densification of the printed wiring boards to cope with the recent trend of electronic equipment toward decreasing weight and size, the desirability of producing a solder resist having high performance with good workability has been finding growing recognition. Furthermore, in view of miniaturization, reduction in weight, and high performance of electronic equipment, miniaturization of a semiconductor package having a plurality of pins is put in practical use and the mass production thereof is developed. To cope with such high densification of the printed wiring board, the IC packages called BGA (ball grid array), CSP (chip scale package), etc. are recently used instead of the IC packages called QFP (quad flat-pack package), SOP (small outline package), etc. As a solder resist used for such a package substrate or a printed wiring board to be mounted in an automobile, various photosensitive resin compositions are heretofore proposed (for example, see JP 61-243869A).

In packages having a solder resist, since a substrate and a solder resist are heated at the time of sealing an IC chip and driving the IC, they are liable to cause cracks and peeling of the solder resist due to the difference in the expansion coefficient between the substrate and the solder resist. Therefore, for the purpose of suppressing the occurrence of cracks and peeling of the solder resist which are produced at the time of a pressure cooker test (hereafter abbreviated as "PCT") or thermal cycling, the incorporation of an inorganic filler into a photosensitive resin composition that forms the solder resist is widely performed conventionally so that the linear thermal expansion coefficient of the solder resist corresponds to that of the substrate used as a base of the solder resist as far as possible. However, when a large amount of inorganic filler is incorporated into a photosensitive resin composition in order to make the linear thermal expansion coefficient thereof as low as possible, inorganic filler particles become present in the interface between the solder resist formed and the base, which poses a problem of deteriorating the adhesion of the solder resist to the base.

Further, since an inorganic filler generally exhibits high opacifying effects or ultraviolet absorbing power depending on a material, when a photosensitive resin composition contains a large amount of inorganic filler, there is a problem of decreasing the substantial dose of ultraviolet irradiation to a photosensitive resin and thus easily causing undercure thereof. In order to solve such a problem, there is proposed to prepare a photosensitive resin layer as a two-layer structure; the first photosensitive resin layer containing an inorganic filler being formed on a substrate, and the second photosensitive resin layer that does not contain an inorganic filler being laminated thereon, as disclosed in JP 10-207046A. Such a two-layer structure aims at allowing patterning with a small dose, as compared with the case where only the photosensitive resin layer containing the inorganic filler is patterned as being conventionally performed. That is, since the second photosensitive resin layer will not suffer from the interception or absorption of ultraviolet rays by the inorganic filler, the net dose of ultraviolet irradiation will increase even with the same irradiation dose and the sensitivity as a whole will be seemingly improved.

SUMMARY OF THE INVENTION

When a two-layer structure is prepared as described above by forming the first photosensitive resin layer containing an inorganic filler on a substrate and laminating thereon the second photosensitive resin layer that does not contain an inorganic filler, however, it is necessary to incorporate a large amount of inorganic filler into the first photosensitive resin layer to maintain a linear thermal expansion coefficient of the photosensitive resin layers as low as possible. In this case, the inorganic filler particles become present in the interface between the photosensitive resin layers formed and the substrate as described above, which poses a problem of deteriorating the adhesion of the photosensitive resin layers to the substrate and easily occurring the peeling thereof. Further, when it is prepared as a photosensitive dry film, it poses such problems that it will easily cause handling cracks and thus secure the initial adhesiveness at the time of lamination to the substrate only with difficulty.

It is, therefore, an object of the present invention to solve the problems of the prior art mentioned above and to provide a layered structure which exhibits excellent adhesion between a photosensitive resin layer and a substrate and can maintain a linear thermal expansion coefficient of the photosensitive resin layer as a whole as low as possible without causing deterioration of resolution.

A more concrete object of the present invention is to provide a highly reliable layered structure, such as a printed wiring board, of which cured film of a photosensitive resin layer excels in various characteristics, such as resistance to heat, resolution, resistance to electroless plating, and electrical properties required of a solder resist of a printed wiring board and an interlayer insulation material of a multilayered wiring board, and elasticity and toughness required of an IC package, without causing peeling at the time of PCT and thermal cycling.

A further object of the present invention is to provide a highly reliable photosensitive dry film excelling in various characteristics mentioned above, which can secure good initial adhesiveness at the time of lamination to a substrate, without causing handling cracks, and thus capable of coping with the high densification and surface mounting of a printed wiring board.

To accomplish the object described above, the present invention provides a layered structure having at least a substrate and a photosensitive resin layer or cured film layer formed on the substrate and containing an inorganic filler, wherein the content of the inorganic filler in the photosensitive resin layer or cured coating layer mentioned above is low on a side contacting the substrate and high on a surface side away from the substrate.

Incidentally, the photosensitive resin layer mentioned above includes a pattern-formable photosensitive resin layer which has not been exposed to an activity energy ray. The cured film layer mentioned above includes a cured film obtained by carrying out photo-curing by exposure to an activity energy ray, particularly a cured film obtained by carrying out photo-curing on copper, a cured film obtained by carrying out photo-curing in a prescribed pattern, and a patterned cured film obtained by carrying out exposure to light and development, preferably a cured film obtained by further carrying out the thermal curing after exposure to light and development.

In a preferred embodiment, the content of the inorganic filler in the photosensitive resin layer or cured film layer mentioned above gradually increases continuously obliquely or stepwise from the side contacting the substrate to the surface side away from the substrate. In another preferred embodiment, the photosensitive resin layer or cured film layer mentioned above comprises at least two layers having different inorganic filler contents, wherein the content of the inorganic filler in the photosensitive resin layer or cured film layer on the surface side away from the substrate is higher than the content of the inorganic filler in the photosensitive resin layer or cured film layer on the side contacting the substrate. In this case, the content of the inorganic filler in the above-mentioned photosensitive resin layer or cured film layer on the side contacting the substrate is less than 38% by volume of the total amount of nonvolatile content, and the content of the inorganic filler in the above-mentioned photosensitive resin layer or cured film layer on the surface side away from the substrate is in the range of 38% to 60% by volume of the total amount of nonvolatile content.

In a further preferred embodiment, a cured product of the above-mentioned photosensitive resin layer or cured film layer on the surface side away from the substrate having the inorganic filler content in the range of 38% to 60% by volume of the total amount of nonvolatile content exhibits a linear thermal expansion coefficient of $15 \times 10^{-6}$/K to $35 \times 10^{-6}$/K (hereinafter abbreviated as "ppm").

In another preferred embodiment, the composition of the inorganic filler (the kinds, combinations, and amounts of the inorganic fillers) contained in the photosensitive resin layer or cured film layer mentioned above is different between the side contacting the substrate and the surface side away from the substrate. In this case, it is desirable that the inorganic filler which is contained in the above-mentioned photosensitive resin layer or cured film layer on the side contacting the substrate contain Si and/or Ba, and the inorganic filler which is contained in the above-mentioned photosensitive resin layer or cured film layer on the surface side away from the substrate contain Mg and/or Al.

The layered structure of the present invention may be any layered structures used for any applications. Particularly preferably, the aforementioned substrate is a wiring board having a conductor circuit layer formed in advance thereon, and the aforementioned layered structure is a printed wiring board having a solder resist or interlayer resin insulation layer formed from said cured film layer.

According to the present invention, there is further provided a photosensitive dry film having a photosensitive resin layer which contains an inorganic filler, the photosensitive resin layer being adapted to be adhered to a member for adhesion (substrate) and capable of forming a pattern, wherein the content of the inorganic filler in the photosensitive resin layer is low on a side to be adhered to the member for adhesion (substrate) and high on a surface side away from the member for adhesion (substrate).

The preferred embodiments concerning the photosensitive resin layer of the above-mentioned layered structure can also be applied to this photosensitive dry film as it is.

Since in the layered structure of the present invention the content of the inorganic filler in the photosensitive resin layer or cured coating layer mentioned above is low on the side contacting the substrate and high on the surface side away from the substrate and thus the inorganic filler hardly touches the substrate of a base, the adhesiveness is improved. Particularly, when the inorganic filler contained in the aforementioned photosensitive resin layer or cured coating layer contacting the substrate contains Si and/or Ba, the adhesiveness to the substrate is considerably improved. Further, since the portion with a lower inorganic filler content of the side contacting the substrate is in the state covered with the portion with a higher inorganic filler content of the surface side away from the substrate, resistance to moist heat is improved. Since the inorganic filler content of the surface side away from the substrate is high, a linear thermal expansion coefficient can be made low. Further, when the substrate is a wiring board, for example, since the portion with a lower inorganic filler content of the side contacting the substrate is in the state of covering the copper circuit formed on the substrate, the apparent linear thermal expansion coefficient as a whole of these portions becomes low, and, as a result, the apparent linear thermal expansion coefficient of the photosensitive resin layer as the whole can be kept low. Particularly, it is desirable that the inorganic filler contained in the photosensitive resin layer of the surface side away from the substrate contain Mg and/or Al which are in the shape of a scaly, plate-like, or crushed form and exhibit higher effect of reducing the linear thermal expansion coefficient. The problem of undercure generally arises in the depths of the side contacting the substrate in many cases, namely, is grasped as a problem of the photo-curing of the depths of the photosensitive resin layer. However, since the inorganic filler content of the side contacting the substrate is low, it becomes difficult to produce the problem of the photo-curing of the depths of the photosensitive resin layer. Further, the problem of resolution may also be solved by the selection of an inorganic filler. Particularly, high resolution is obtained by selecting the inorganic filler having a refractive index within the range of 1.45 to 1.65. The reason for this effect is considered that the refractive index of a resin of a photosensitive resin composition corresponds to that of an inorganic filler, thereby making it possible for the composition to prevent halation and obtain high resolution. By having such constitutional features, it is possible to maintain a linear thermal expansion coefficient of the photosensitive resin layer as a whole as low as possible, and the photosensitive resin layer exhibits excellent adhesiveness to a substrate and high sensitivity and do not cause peeling at the time of PCT and thermal cycling. Since a cured film of a photosensitive resin layer excels in various characteristics, such as resistance to heat, resolution, resistance to electroless plating, and electrical properties required of a solder resist of a printed wiring board and an interlayer insulation material or the like of a multilayered wiring board, and elasticity and toughness required of an IC package, it is possible to provide a highly reliable layered structure, such as a printed wiring board.

Further, the above outstanding effects can be exerted also in a photosensitive dry film as it is as long as it has a profile of the inorganic filler content described above. Accordingly, it is possible to provide a highly reliable photosensitive dry film excelling in various characteristics mentioned above, which can secure good initial adhesiveness at the time of lamination to a substrate without causing handling cracks and thus capable of coping with the high densification and surface mounting of a printed wiring board.

DETAILED DESCRIPTION OF THE INVENTION

The present inventors, after pursuing a diligent study to solve the problems mentioned above, have found that in a layered structure having at least a substrate and a photosensitive resin layer or cured film layer formed on the substrate and containing an inorganic filler, when it has such a structure that the content of the inorganic filler in the photosensitive resin layer or cured coating layer mentioned above is low on a side contacting the substrate and high on a surface side away from the substrate, thanks to the functions and effects described above, it is possible to maintain a linear thermal expansion coefficient of the photosensitive resin layer as a whole as low as possible, the photosensitive resin layer exhibits excellent adhesiveness to the substrate and high sensitivity and do not cause peeling of the photosensitive resin layer at the time of PCT and thermal cycling, and since a cured film of the photosensitive resin layer excels in various characteristics, such as resistance to heat, resolution, resistance to electroless plating, and electrical properties required of a solder resist of a printed wiring board and an interlayer insulation material or the like of a multilayered wiring board, and elasticity and toughness required of an IC package, it is possible to provide a highly reliable layered structure, such as a printed wiring board. As a result, the present invention has been perfected.

Here, the layered structures of the present invention will be described with reference to the drawings which schematically illustrate them.

Figure 1:
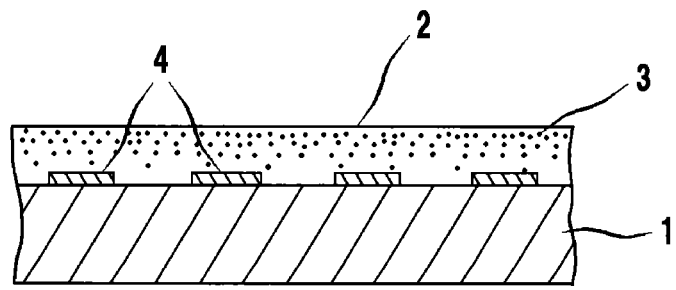
FIG. 1 is a fragmentary cross-sectional view schematically illustrating an embodiment of the layered structure of the present invention.

First, FIG. 1 is a fragmentary cross-sectional view schematically illustrating a fundamental concept of the layered structure of the present invention. As described above, the structure is such that the inorganic filler content in a photosensitive resin layer (or cured film layer) 2, which contains an inorganic filler 3 and is formed on a substrate 1, is low on the side contacting the substrate 1 and high on the surface side away from the substrate 1. Incidentally, reference numeral 4 denotes a conductor circuit layer when a wiring board having a conductor circuit layer of copper, for example, formed in advance thereon is used as a substrate.

Figure 2:
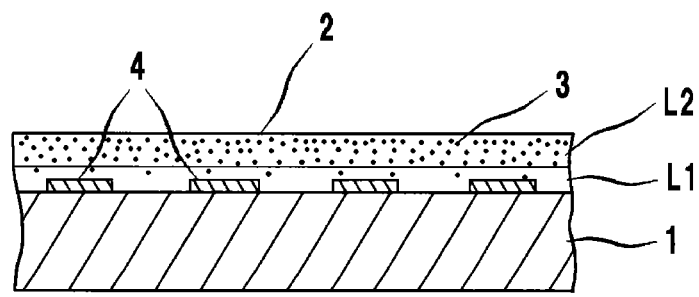
FIG. 2 is a fragmentary cross-sectional view schematically illustrating another embodiment of the layered structure of the present invention.

FIG. 2 shows schematically another embodiment of the layered structure of the present invention and has two-layer structure. Namely, a photosensitive resin layer (or cured film layer) 2, which contains an inorganic filler 3 and formed on a substrate 1, comprises the first photosensitive resin layer (or first cured film layer) L1 contacting the substrate and the second photosensitive resin layer (or second cured film layer) L2 formed thereon. The content of the inorganic filler 3 in the second photosensitive resin layer (or the second cured film layer) L2 is high, and the content of the inorganic filler 3 in the first photosensitive resin layer (or the first cured film layer) L1 is low or it does not contain the inorganic filler. Incidentally, reference numeral 4 denotes a conductor circuit layer.

The two-layer structure mentioned above may be produced by, for example, a simultaneous coating method in which a composition for the first photosensitive resin layer and a composition for the second photosensitive resin layer are simultaneously applied onto a substrate that is conveyed from the discharge mouths of two coating heads arranged adjacently, respectively, and dried, a two-step coating method in which the composition for the first photosensitive resin layer is firstly applied onto a substrate from the individual coating head and dried and then the composition for the second photosensitive resin layer is applied onto the substrate and dried, a coating method in which the composition for the first photosensitive resin layer and the composition for the second photosensitive resin layer are subsequently applied onto a substrate in one coating step from two respective coating heads arranged along the conveyance direction of the substrate and dried, or a method in which the composition for the first photosensitive resin layer and the composition for the second photosensitive resin layer are applied onto the respective carrier films from the respective coating heads and dried, and then laminating them. At this time, since the composition for the first photosensitive resin layer has a low content of the inorganic filler 3 or does not contain it, the composition exhibits good flowability and excellent workability, and the adhesiveness thereof to a substrate also becomes good. Incidentally, the above coating methods may also be used for the production of the aforementioned photosensitive dry film.

Figure 3:
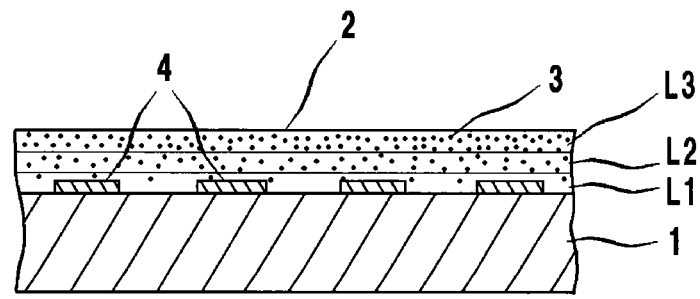
FIG. 3 is a fragmentary cross-sectional view schematically illustrating still another embodiment of the layered structure of the present invention.

FIG. 3 shows schematically still another embodiment of the layered structure of the present invention and has three-layer structure. Namely, a photosensitive resin layer (or cured film layer) 2, which contains an inorganic filler 3 and is formed on a substrate 1, comprises the first photosensitive resin layer (or first cured film layer) L1 contacting the substrate, the second photosensitive resin layer (or second cured film layer) L2 formed thereon, and further the third photosensitive resin layer (or third cured film layer) L3 formed thereon, The content of the inorganic filler 3 in the third photosensitive resin layer (or the third cured film layer) L3 is high. The content of the inorganic filler 3 in the second photosensitive resin layer (or the second cured film layer) L2 is lower than the content of the inorganic filler 3 in the third photosensitive resin layer (or the third cured film layer) L3. Further, The content of the inorganic filler 3 in the first photosensitive resin layer (or the first cured film layer) L1 is lower than the content of the inorganic filler 3 in the second photosensitive resin layer (or the second cured film layer) L2 or it does not contain the inorganic filler. Incidentally, reference numeral 4 denotes a conductor circuit layer.

By constituting the multilayer structure as mentioned above, it is possible to gradually increase stepwise the content of the inorganic filler in the photosensitive resin layer or cured film layer stepwise from the side contacting the substrate mentioned above to the surface side away from the substrate. Further, it is also possible to make such a structure that the content of the inorganic filler in the photosensitive resin layer or cured film layer continuously increases obliquely from the side contacting the substrate mentioned above to the surface side away from the substrate by preparing many thin photosensitive resin layers or cured film layers having different inorganic filler contents and laminating them on the substrate starting from the layer of lower inorganic filler content up to the layer of higher inorganic filler content successively, because the inorganic filler near each interface between the layers easily migrates to a layer having a low inorganic filler content during the application and drying steps.

As the aforementioned inorganic filler, any known and commonly used inorganic fillers such as, for example, silica, barium sulfate, talc, clay, magnesium carbonate, calcium carbonate, aluminum oxide, aluminum hydroxide, boehmite, mica powder, hydrotalcite, Sillitin, and Sillicolloid may be used. These fillers may be used either singly or in the form of a mixture of two or more members. As a result of detailed examination about the refractive index of the filler, it has been found that not only excellent PCT resistance and HAST resistance (resistance to highly accelerated stress test) but also good resolution is acquired when the refractive index of the filler falls within the range of 1.45 to 1.65. It is considered that the high resolution is acquired because the refractive index of an aromatic ring-containing resin used for improving PCT resistance and HAST resistance is in the neighborhood of the refractive index of the filler. Particularly preferred fillers are barium sulfate (refractive index: 1.64) as a filler containing Ba, talc (refractive index: 1.54-59) and magnesium carbonate (refractive index: 1.57-1.60) as a filler containing Mg, clay (refractive index: 1.55-1.57), aluminum oxide (refractive index: 1.65), aluminum hydroxide (refractive index: 1.57), boehmite (refractive index: 1.62-1.65), and mica powder (refractive index: 1.59) as a filler containing aluminum, and hydrotalcite (refractive index: 1.50) and natural agglomerate (refractive index 1.55) called Sillitin and Sillicolloid, which have such a structure that spherical silica and lamellar kaolinite are mutually bonded loosely, as a filler containing Mg and Al.

It is preferable that the inorganic filler contained in the photosensitive resin layer or cured film layer (L1) on the side contacting a substrate should contain Si and/or Ba, because the adhesiveness to the substrate is considerably improved. In particular, spherical silica or Sillitin (Sillicolloid) proves to be desirable.

Since spherical silica does not have a surface acting as a starting point of cracks of a cured film, it has an effect of improving resistance to cracking even with a small amount. As the spherical silica, the commercially available spherical silica having a mean particle diameter of 0.25 μm, 0.5 μm, 1 μm, 1.5 μm, 2 μm, 3 μm, 5 μm, etc. may be used as it is. As the commercially available products thereof, SO series manufactured by Admatechs Company Limited may be cited. Although a silane coupling agent or the like may be directly blended to the composition containing this spherical silica, it is desirable from the viewpoint of resistance to cracking that the spherical silica should be preliminarily subjected to a surface treatment with a solvent and a silane coupling agent by means of a bead mill etc. so that the silane coupling agent may be dispersed to uniformly cover the surface of silica, the particles of not less than 5 μm should be filtered out by filtering etc., and the remaining particles should be used. The above-mentioned coupling treatment is also effective and preferable for Sillitin and Sillicolloid besides spherical silica.

On the other hand, it is preferable that the inorganic filler contained in the photosensitive resin layer or cured film layer (L2 in the case of two layers or L3 in the case of three layers) on the surface side away from the substrate should contain Mg and/or Al, particularly have a refractive index falling within the range of 1.52 to 1.59. These fillers have a refractive index more approaching to a photosensitive resin layer, and thus the resolution is good even if they are added to the composition in a large amount of 38% to 60% by volume. Since such fillers have indefinite, scaly, or plate-like particle shapes, they have a higher effect of reducing a linear thermal expansion coefficient. Therefore, they can contribute to maintain the apparent linear thermal expansion coefficient of the photosensitive resin layer as a whole low. That is, it is possible to suppress the linear thermal expansion coefficient of a cured product itself of a photosensitive resin layer or a cured film layer itself, which contains the inorganic filler containing Mg and/or Al, within the range of 15 to 35 ppm.

The total amount of the filler in all the photosensitive resin layers or cured film layers is preferred to be in the range of 10% to 55% by volume of the total amount of the nonvolatile content. If the filler content is less than 10% by volume, undesirably the cured product of the photocurable resin composition will exhibit reduced resistance to moist heat and its PCT resistance will be deteriorated. Conversely, if the filler content exceeds 55% by volume, undesirably the viscosity of the composition will become high, its coating properties and moldability will become inferior, and further the PCT resistance and HAST resistance will be deteriorated because the adhesiveness will also be deteriorated.

Incidentally, in the case of multilayer structure, the content of the inorganic filler in the photosensitive resin layer or cured film layer (L1) on the side contacting the substrate mentioned above is preferred to be less than 38% by volume of the total amount of the nonvolatile content of that layer. The content of the inorganic filler in the photosensitive resin layer or cured film layer (L2 in the case of two layers or L3 in the case of three layers) on the surface side away from the substrate mentioned above is preferred to be in the range of 38% to 60% by volume of the total amount of the nonvolatile content of that layer.

Although the layered structure and the photosensitive dry film of the present invention are characterized by having a content profile of an inorganic filler as described above, as a photosensitive resin composition for forming a photosensitive resin layer or a cured film layer, various known photocurable resin compositions or photocurable and thermosetting resin compositions may be used without being limited to a specific curable resin composition. From the viewpoint of reducing the environmental impact, however, the alkali-developable photocurable resin compositions or photocurable and thermosetting resin compositions prove to be preferable. In this case, it becomes possible to give alkali-developing properties to the composition by the use of a carboxyl group-containing resin.

As the carboxyl group-containing resin, any well-known resins having a carboxyl group in its molecule may be used. Particularly, from the viewpoint of the photo-curing properties and resistance to development, a carboxyl group-containing photosensitive resin having an ethylenically unsaturated double bond in its molecule is preferred. The unsaturated double bond is preferred to be originated from acrylic acid, methacrylic acid, or derivatives thereof. Incidentally, when a carboxyl group-containing resin having no ethylenically unsaturated double bond is used singly, in order to impart photo-curing properties to the composition, it is necessary to use it in combination with a compound having a plurality of ethylenically unsaturated double bonds in its molecule, i.e. a photopolymerizable monomer, which will be described hereinafter.

As concrete examples of the carboxyl group-containing resin, the compounds (any of oligomer or polymer may be sufficient) enumerated below can be advantageously used.

(1) A carboxyl group-containing resin obtained by the copolymerization of an unsaturated carboxylic acid, such as (meth)acrylic acid, with a compound having an unsaturated double bond, such as styrene, α-methylstyrene, low-molecular alkyl (meth)acrylate, and isobutylene, (2) a carboxyl group-containing urethane resin obtained by the polyaddition reaction of a diisocyanate, such as an aliphatic diisocyanate, a branched aliphatic diisocyanate, an alicyclic diisocyanate, and an aromatic diisocyanate, with a carboxyl group-containing dialcohol compound, such as dimethylolpropionic acid and dimethylolbutanoic acid, and a diol compound, such as a polycarbonate-based polyol, a polyether-based polyol, a polyester-based polyol, a polyolefin-based polyol, an acrylic polyol, a bisphenol A-based alkylene oxide adduct diol, and a compound having a phenolic hydroxyl group and an alcoholic hydroxyl group, (3) a carboxyl group-containing photosensitive urethane resin obtained by the polyaddition reaction of a diisocyanate with a (meth)acrylate of a bifunctional epoxy resin, such as a bisphenol A-based epoxy resin, a hydrogenated bisphenol A-based epoxy resin, a bisphenol F-based epoxy resin, a bisphenol S-based epoxy resin, a bixylenol-based epoxy resin, and a biphenol-based epoxy resin, or its partially modified product with an acid anhydride, and a carboxyl group-containing dialcohol compound and a diol compound, (4) a carboxyl group-containing photosensitive urethane resin obtained by adding a compound having one hydroxyl group and one or more (meth)acryloyl groups in its molecule, such as a hydroxyalkyl (meth)acrylate, during the synthesis of the above resin (2) or (3) so as to introduce the (meth) acrylated end thereto, (5) a carboxyl group-containing photosensitive urethane resin obtained by adding a compound having one isocyanate group and one or more (meth)acryloyl groups in its molecule, such as an equimolar reaction product of isophorone diisocyanate and pentaerythritol triacrylate, during the synthesis of the above resin (2) or (3) so as to introduce the (meth)acrylated end thereto, (6) a carboxyl group-containing photosensitive resin obtained by causing (meth)acrylic acid to react with a polyfunctional (solid) epoxy resin of bifunctionality or more functionality to be described hereinafter and then adding a dibasic acid anhydride to a resultant hydroxyl group which is present in a side chain, (7) a carboxyl group-containing photosensitive resin obtained by causing (meth)acrylic acid to react with a polyfunctional epoxy resin produced by further epoxidizing a hydroxyl group of a bifunctional (solid) epoxy resin to be described hereinafter with epichlorohydrin and then adding a dibasic acid anhydride to a resultant hydroxyl group, (8) a carboxyl group-containing polyester resin obtained by causing a dicarboxylic acid, such as adipic acid, phthalic acid, and hexahydrophthalic acid, to react with a bifunctional oxetane resin to be described hereinafter and then adding a dibasic acid anhydride, such as phthalic anhydride, tetrahydrophthalic anhydride, and hexahydrophthalic anhydride, to a resultant primary hydroxyl group, (9) a carboxyl group-containing photosensitive resin obtained by causing an unsaturated group-containing monocarboxylic acid to react with a reaction product of a compound have a plurality of phenolic hydroxyl groups in its molecule and an alkylene oxide, such as ethylene oxide and propylene oxide, and then causing a polybasic acid anhydride to react with the resultant reaction product,

(10) a carboxyl group-containing photosensitive resin obtained by causing an unsaturated group-containing monocarboxylic acid to react with a reaction product of a compound have a plurality of phenolic hydroxyl groups in its molecule and a cyclic carbonate compound, such as ethylene carbonate and propylene carbonate, and then causing a polybasic acid anhydride to react with the resultant reaction product, and

(11) carboxyl group-containing photosensitive resins obtained by further adding a compound having one epoxy group and one or more (meth)acryloyl groups in its molecule to the above-mentioned resins (1) to (10).

Incidentally, the term "(meth)acrylate" as used in the present specification refers collectively to acrylate, methacrylate and a mixture thereof. This holds good for other similar representation.

Since the carboxyl group-containing resins mentioned above have numerous carboxyl groups added to the side chains of a backbone polymer, the compositions containing these resins are developable with a dilute aqueous alkaline solution.

The acid value of the carboxyl group-containing resin mentioned above is desired to be in the range of 40 to 200 mg KOH/g, preferably in the range of 45 to 120 mg KOH/g. If the acid value of the carboxyl group-containing resin is less than 40 mg KOH/g, the development of the composition with an aqueous alkaline solution will be performed only with difficulty. Conversely, if the acid value exceeds 200 mg KOH/g, the dissolving out of the exposed area in a developing solution will proceed, the line width will become narrow unduly, occasionally a coating film is dissolved out in a developing solution and separated from a substrate regardless of the exposed area or unexposed area and, as a result, the formation of a proper resist pattern may be attained only with difficulty.

The weight-average molecular weight of the carboxyl group-containing resin mentioned above is generally desired to fall in the range of 2,000 to 150,000, preferably 5,000 to 100,000, though it varies depending on the skeleton of the resin. If the weight-average molecular weight of the resin is less than 2,000, there is a possibility of impairing the tack-free touch of a coating film and also resistance to humidity of the coating film after exposure to light, thereby causing reduction in film thickness during the developing process and considerably impairing the resolution. Conversely, if the weight-average molecular weight exceeds 150,000, there is a possibility of impairing the developing properties of the coating film and the storage stability of the composition.

The amount of the aforementioned carboxyl group-containing resin to be incorporated in the composition is preferred to account for a proportion in the range of 20% to 60% by weight, preferably 30% to 50% by weight, based on the total amount of the composition. If the amount of the carboxyl group-containing resin to be incorporated is unduly smaller than the lower limit of the range mentioned above, the coating film containing the resin will be at a disadvantage in acquiring decreased film strength. Conversely, if the amount is unduly larger than the upper limit of the range mentioned above, the composition containing the resin will be at a disadvantage in acquiring increased viscosity or inferior coating properties.

The aforementioned carboxyl group-containing resin is not limited to those enumerated above and any carboxyl group-containing resins may be used either singly or in the form of a mixture of two or more members. Among other carboxyl group-containing resins mentioned above, in particular the aromatic ring-containing resins prove to be preferable in view of the high refractive index and excellent resolution thereof, and further the resins having a novolak structure prove to be preferable because they excels in not only resolution but also the resistance to PCT or cracking. Further, a carboxyl group-containing resin using a phenolic compound as a starting material like the aforementioned carboxyl group-containing resins (9) and (10) also prove to be preferable because the PCT resistance is improved. Particularly, in the photosensitive resin layer or cured film layer (L2 or L3) on the surface side away from a substrate, water absorption will easily take place in the interfaces between fillers and a resin if the amount of the filler component is increased. On the contrary, the carboxyl group-containing resins having the novolak structure and the above-mentioned carboxyl group-containing resins (9) and (10) exhibited considerably excellent PCT resistance even if the amount of the filler component is increased. The reason for this phenomenon is considered as follows; in the former the hydrophobicity is improved by the novolac structure, and in the latter the hydrophobicity is remarkably improved because the carboxyl group-containing resins like the above-mentioned resins (9) and (10) do not have a hydroxyl group, unlike the carboxyl group-containing resins which are capable of forming a similar structure but having the epoxy acrylate structure containing a hydroxyl group, like the above-mentioned resins (6) and (7). Particularly preferred novolak structures are the cresol novolak structure and the biphenyl novolak structure both exhibiting high hydrophobicity.

The photosensitive resin composition for forming a photosensitive resin layer or a cured film layer contains a photopolymerization initiator. As the photopolymerization initiator, one or more of photopolymerization initiators selected from the group consisting of oxime ester-based photopolymerization initiators having an oxime ester group, α-aminoacetophenone-based photopolymerization initiators, and acylphosphine oxide-based photopolymerization initiators may be used.

As the commercially available oxime ester-based photopolymerization initiators, CGI-325, IRGACURE (registered trademark) OXE01, and IRGACURE OXE02 manufactured by Ciba Japan Ltd., N-1919 and ADEKA ARKLS NCI-831 manufactured by ADEKA CORPORATION, etc. may be cited. Further, photopolymerization initiators having two oxime ester groups in its molecule may also be preferably used. As concrete examples thereof, oxime ester compounds having the carbazole structure represented by the following general formula may be cited.

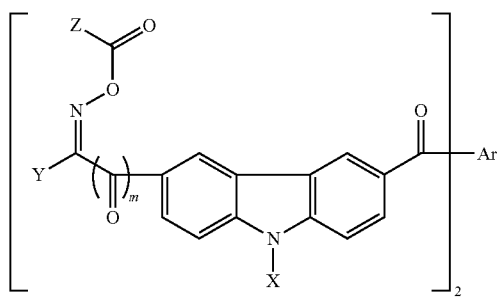

In the formula, X represents a hydrogen atom, an alkyl group of 1-17 carbon atoms, an alkoxy group of 1-8 carbon atoms, a phenyl group, a phenyl group substituted by an alkyl group of 1-17 carbon atoms, an alkoxy group of 1-8 carbon atoms, an amino group, or an alkylamino group or dialkylamino group having an alkyl group of 1-8 carbon atoms, or a naphthyl group substituted by an alkyl group of 1-17 carbon atoms, an alkoxy group of 1-8 carbon atoms, an amino group, or an alkylamino group or dialkylamino group having an alkyl group of 1-8 carbon atoms, Y and Z independently represent a hydrogen atom, an alkyl group of 1-17 carbon atoms, an alkoxy group of 1-8 carbon atoms, a halogen group, a phenyl group, a phenyl group substituted by an alkyl group of 1-17 carbon atoms, an alkoxy group of 1-8 carbon atoms, an amino group, or an alkylamino group or dialkylamino group having an alkyl group of 1-8 carbon atoms, or a naphthyl group substituted by an alkyl group of 1-17 carbon atoms, an alkoxy group of 1-8 carbon atoms, an amino group, or an alkylamino group or dialkylamino group having an alkyl group of 1-8 carbon atoms, an anthryl group, a pyridyl group, a benzofuryl group, or a benzothienyl group, Ar represents a single bond, an alkylene of 1-10 carbon atoms, a vinylene, a phenylene, a biphenylene, a pyridylene, a naphthylene, an anthorylene, a thienylene, a furylene, 2,5-pyrrole-diyl, 4,4'-stilbene-diyl, or 4,2'-styrene-diyl, and "m" is an integer of 0 or 1.

Particularly, it is preferred that in the above-mentioned formula X and Y be a methyl group or an ethyl group, respectively, Z be a methyl or a phenyl, m is 0, and Ar is a single bond, a phenylene, a naphthylene, or a thienylene.

The amount of the above-mentioned oxime ester-based photopolymerization initiator to be incorporated in the composition is preferred to be in the range of 0.01 to 5 parts by weight, based on 100 parts by weight of the aforementioned carboxyl group-containing resin. If the amount is less than 0.01 part by weight based on 100 parts by weight of the above-mentioned carboxyl-group containing resin, the photo-curing properties of the resultant photosensitive resin composition on copper becomes insufficient, thereby undesirably causing the separation of a coating film and deterioration of the properties of the coating film, such as resistance to chemicals. Conversely, if the amount of the oxime ester-based photopolymerization initiator exceeds 5 parts by weight based on 100 parts by weight of the above-mentioned carboxyl-group containing resin, undesirably the photo-curing properties in a deep portion of the coating film will tend to become inferior due to the increasing light absorption by the photopolymerization initiator in the surface of the coating film of solder resist. The more preferred amount is 0.5 to 3 parts by weight, based on 100 parts by weight of the aforementioned carboxyl group-containing resin.

As concrete examples of the α-aminoacetophenone-based photopolymerization initiator, 2-methyl-1-[4-(methylthio)phenyl]-2-morpholinopropan-1-one, 2-benzyl-2-dimethylamino-1-(4-morpholinophenyl)-butan-1-one, 2-(dimethylamino)-2-[(4-methylphenyl)methyl]-1-[4-(4-morpholinyl)phenyl]-butan-1-one, N,N-dimethylaminoacetophenone, etc. may be cited. As the commercially available products thereof, IRGACURE 907, IRGACURE 369, and IRGACURE 379 manufactured by Ciba Japan Ltd., etc. may be cited.

As concrete examples of the acylphosphine oxide-based photopolymerization initiator, 2,4,6-trimethylbenzoyl-diphenyl phosphine oxide, bis(2,4,6-trimethyl benzoyl)-phenyl phosphine oxide, bis(2,6-dimethoxybenzoyl)-2,4,4-trimethyl-pentyl phosphine oxide, etc. may be cited. As the commercially available products thereof, LUCIRIN (registered trademark) TPO manufactured by BASF Ltd., IRGACURE 819 manufactured by Ciba Japan Ltd., etc. may be cited.

The amount of these α-aminoacetophenone-based photopolymerization initiator and acylphosphine oxide-based photopolymerization initiator to be incorporated in the composition is preferred to be in the range of 0.01 to 15 parts by weight, based on 100 parts by weight of the aforementioned carboxyl group-containing resin. If the amount is less than 0.01 part by weight based on 100 parts by weight of the above-mentioned carboxyl-group containing resin, the photo-curing properties of the resultant photosensitive resin composition on copper become insufficient, thereby undesirably causing the separation of a coating film and deterioration of the properties of the coating film, such as resistance to chemicals. Conversely, if the amount exceeds 15 parts by weight based on 100 parts by weight of the above-mentioned carboxyl-group containing resin, undesirably the effect of reducing outgassing will not be attained and the photo-curing properties in a deep portion of the coating film will tend to become inferior due to the increasing light absorption by the photopolymerization initiator in the surface of the coating film of solder resist. The more preferred amount is 0.5 to 10 parts by weight, based on 100 parts by weight of the aforementioned carboxyl group-containing resin.

As the photopolymerization initiators to be used, the above-mentioned oxime ester-based initiators prove to be preferable because the outgassing will be suppressed with a small amount thereof and they are effective in resisting PCT and cracking. The use of the acyl phosphine oxide-based photopolymerization initiator together with the oxime ester-based initiator is particularly preferable because the shape of good resolution is obtained.

As the other photopolymerization initiators, photo-initiator aids and sensitizers which may be preferably used in the photosensitive resin composition, a benzoin compound, an acetophenone compound, an anthraquinone compound, a thioxanthone compound, a ketal compound, a benzophenone compound, a tertiary amine compound, a xanthone compound, etc. may be cited.

As concrete examples of the benzoin compound, for example, benzoin, benzoin methyl ether, benzoin ethyl ether, benzoin isopropyl ether, etc. may be cited.

As concrete examples of the acetophenone compound, for example, acetophenone, 2,2-dimethoxy-2-phenyl acetophenone, 2,2-diethoxy-2-phenyl acetophenone, 1,1-dichloroacetophenone, etc. may be cited.

As concrete examples of the anthraquinone compound, for example, 2-methylanthraquinone, 2-ethylanthraquinone, 2-t-butylanthraquinone, 1-chloroanthraquinone, etc. may be cited.

As concrete examples of the thioxanthone compound, for example, 2,4-dimethylthioxanthone, 2,4-diethylthioxanthone, 2-chlorothioxanthone, 2,4-diisopropylthioxanthone, etc. may be cited.

As concrete examples of the ketal compound, for example, acetophenone dimethyl ketal, benzyl dimethyl ketal, etc. may be cited.

As concrete examples of the benzophenone compound, for example, benzophenone, 4-benzoyldiphenylsulfide, 4-benzoyl-4'-methyldiphenylsulfide, 4-benzoyl-4'-ethyldiphenylsulfide, 4-benzoyl-4'-propyldiphenylsulfide, etc. may be cited.

As concrete examples of the tertiary amine compound, for example, an ethanolamine compound and a compound having dialkylaminobenzene structure may be cited. As the commercially available products thereof, for example, dialkylaminobenzophenones such as 4,4'-dimethylaminobenzophenone (NISSO Cure MABP manufactured by Nippon Soda Co., Ltd.) and 4,4'-diethylaminobenzophenone (EAB manufactured by Hodogaya Chemical Co., Ltd.), dialkylamino group-containing coumarin compounds such as 7-(diethylamino)-4-methyl-2H-1-benzopyran-2-one (7-(diethylamino)-4-methylcoumarin), ethyl 4-dimethylaminobenzoate (Kaya Cure (registered trademark) EPA manufactured by Nippon Kayaku Co., Ltd.), ethyl 2-dimethylaminobenzoate (Quantacure DMB manufactured by International Biosynthetic Inc.), (n-butoxy)ethyl 4-dimethylaminobenzoate (Quantacure BEA manufactured by International Biosynthetic Inc.), isoamylethyl p-dimethylaminobenzoate (Kaya Cure DMBI manufactured by Nippon Kayaku Co., Ltd.), 2-ethylhexyl 4-dimethylaminobenzoate (Esolol 507 manufactured by Van Dyk GmbH), 4,4'-diethylaminobenzophenone (EAB manufactured by Hodogaya Chemical Co., Ltd.), etc. may be cited.

Among other compounds, a thioxanthone compound and a tertiary amine compound are preferred. Particularly, the incorporation of the thioxanthone compound is preferred from the viewpoint of the photo-curing properties in a deep portion of a coating film. In particular, the incorporation of the thioxanthone compound, such as 2,4-dimethylthioxanthone, 2,4-diethylthioxanthone, 2-chlorothioxanthone, and 2,4-diisopropylthioxanthone, proves to be preferable.

The amount of such a thioxanthone compound to be incorporated in the composition is preferred to be not more than 20 parts by weight, based on 100 parts by weight of the aforementioned carboxyl group-containing resin. If the amount of the thioxanthone compound exceeds 20 parts by weight based on 100 parts by weight of the above-mentioned carboxyl group-containing resin, undesirably the photo-curing properties of the resultant photosensitive resin composition will be deteriorated when its film thickness is large, thereby leading to the increase in cost of a product. The more preferred amount is not more than 10 parts by weight, based on 100 parts by weight of the aforementioned carboxyl group-containing resin.

As the tertiary amine compound, a compound having dialkyl aminobenzene structure is preferred, in particular a dialkylaminobenzophenone compound, a dialkylamino group-containing coumarin compound exhibiting the maximal absorption wavelength in 350-450 nm, and ketocoumarins are preferred.

As the dialkylaminobenzophenone compound, 4,4'-diethylaminobenzophenone is preferred because its toxicity is low. Since the dialkylamino group-containing coumarin compound exhibits the maximal absorption wavelength in 350-410 nm of the ultraviolet region, it has weak tinting power and thus makes possible to provide a colorless, transparent photosensitive composition as well as, by the use of a coloring pigment, a colored solder resist film reflecting the color of the coloring pigment itself. Particularly, 7-(diethylamino)-4-methyl-2H-1-benzopyran-2-one is preferred because it exhibits excellent sensitizing effect to the laser beam of a wavelength of 400-410 nm.

The amount of the tertiary amine compound mentioned above to be incorporated in the composition is preferred to be in the range of 0.1 to 20 parts by weight, based on 100 parts by weight of the aforementioned carboxyl group-containing resin. If the amount is less than 0.1 part by weight based on 100 parts by weight of the above-mentioned carboxyl group-containing resin, the sufficient sensitizing effect will not be attained. Conversely, if the amount exceeds 20 parts by weight based on 100 parts by weight of the above-mentioned carboxyl group-containing resin, undesirably the photo-curing properties in a deep portion of a coating film will tend to become inferior due to the increasing light absorption by the tertiary amine compound in the surface of a dried coating film of solder resist. The more preferred amount is 0.1 to 10 parts by weight, based on 100 parts by weight of the aforementioned carboxyl group-containing resin.

These photopolymerization initiators, photo-initiator aids and sensitizers may be used either singly or in the form of a mixture of two or more members.

The total amount of the photopolymerization initiator, the photo-initiator aid and the sensitizer mentioned above is preferred to be not more than 35 parts by weight, based on 100 parts by weight of the aforementioned carboxyl group-containing resin having the biphenyl novolak structure. If the amount exceeds 35 parts by weight based on 100 parts by weight of the above-mentioned carboxyl group-containing resin, the photo-curing properties in a deep portion of a coating film will tend to become inferior due to the light absorption by these compounds.

Incidentally, since the photopolymerization initiators, photo-initiator aids and sensitizers mentioned above absorb the light of specific wavelength, under certain circumstances they may act as an ultraviolet light absorber and the sensitivity may become low. However, they are not used for the purpose of only increasing the sensitivity of a composition. By formulating the composition so as to absorb the light of specific wavelength, as occasion demands, thereby increasing the photo-reactivity in the surface, it is possible to change the line shape and the opening of a resist to a perpendicular shape, a tapered shape, or a reverse tapered shape, and to increase the processing accuracy of a line width or an opening diameter.

The photosensitive resin composition to be used in the present invention may further incorporate therein a functional group-containing elastomer. It has been confirmed that the addition of the functional group-containing elastomer is effective in improving coating properties and further the strength of a coating film. As the trade names of the functional group-containing elastomers, for example, R-45HT and Poly bd HTP-9 (all manufactured by IDEMITSU KOSAN Co., Ltd.), EPOLEAD PB3600 (manufactured by Daicel Corporation), DENAREX R-45EPT (manufactured by Nagase Chemtex Corp.), Ricon 130, Ricon 131, Ricon 134, Ricon 142, Ricon 150, Ricon 152, Ricon 153, Ricon 154, Ricon 156, Ricon 157, Ricon 100, Ricon 181, and Ricon 184, Ricon 130MA8, Ricon 130MA13, Ricon 130MA20, Ricon 131MA5, Ricon 131MA10, Ricon 131MA17, Ricon 131MA20, Ricon 184MA6, and Ricon 156MA17 (all manufactured by Sartomer Company), etc. may be cited. Further, a polyester type elastomer, a polyurethane type elastomer, a polyester urethane type elastomer, a polyamide type elastomer, a polyester amide type elastomer, an acrylic elastomer, an olefin type elastomer, etc. may be used. Any resins obtained by modifying part or the whole of the epoxy groups of the epoxy resins having various skeletons with a butadiene-acrylonitrile rubber of which both ends are modified to carboxyl groups may also be used. Moreover, an epoxy group-containing polybutadiene type elastomer, an acryloyl group-containing polybutadiene type elastomer, a hydroxyl group-containing polybutadiene type elastomer, a hydroxyl group-containing isoprene type elastomer, etc. may also be used. The amount of the elastomer mentioned above to be incorporated in the composition is preferred to be in the range of 3 to 124 parts by weight, based on 100 parts by weight of the aforementioned carboxyl group-containing resin. These elastomers may be used either singly or in the form of a mixture of two or more members.

It is preferable that a mercapto compound be added to the photosensitive resin composition to be used in the present invention. It has been confirmed that the PCT resistance and the HAST resistance are improved by the addition of a mercapto compound particularly to the photosensitive resin composition for forming the photosensitive resin layer (L1) on the side contacting a substrate. This is considered due to the improvement of adhesiveness.

As the mercapto compound, for example, mercaptoethanol, mercaptopropanol, mercaptobutanol, mercaptopropanediol, mercaptobutanediol, 1-butanethiol, hydroxybenzenethiol and its derivative, butyl-3-mercaptopropionate, methyl-3-mercaptopropionate, 2,2-(ethylenedioxy)diethanethiol, ethanethiol, 4-methylbenzenethiol, dodecyl mercaptan, propanethiol, butanethiol, pentanethiol, 1-octanethiol, cyclopentanethiol, cyclohexanethiol, thioglycerol, 4,4-thiobisbenzenethiol, etc. may be cited.

As the commercially available products thereof, for example, BMPA, MPM, EHMP, NOMP, MBMP, STMP, TMMP, PEMP, DPMP and TEMPIC (all manufactured by Sakai Chemical Industry Co., Ltd.), Karenz (registered trademark) MT-PE1, Karenz MT-BD1, and Karenz NR1 (all manufactured by Showa Denko K.K.), etc. may be cited.

Further, as a heterocyclic compound having a mercapto group, for example, mercapto-4-butyrolactone (alias: 2-mercapto-4-butanorido), 2-mercapto-4-methyl-4-butyrolactone, 2-mercapto-4-ethyl-4-butyrolactone, 2-mercapto-4-butyrothiolactone, 2-mercapto-4-butyrolactam, N-methoxy-2-mercapto-4-butyrolactam, N-ethoxy-2-mercapto-4-butyrolactam, N-methyl-2-mercapto-4-butyrolactam, N-ethyl-2-mercapto-4-butyrolactam, N-(2-methoxy)ethyl-2-mercapto-4-butyrolactam, N-(2-ethoxy)ethyl-2-mercapto-4-butyrolactam, 2-mercapto-5-valerolactone, 2-mercapto-5-valerolactam, N-methyl-2-mercapto-5-valerolactam, N-ethyl-2-mercapto-5-valerolactam, N-(2-methoxy)ethyl-2-mercapto-5-valerolactam, N-(2-ethoxy)ethyl-2-mercapto-5-valerolactam, 2-mercaptobenzothiazole, 2-mercapto-5-methylthiothiadiazole, 2-mercapto-6-hexanolactam, 2,4,6-trimercapto-s-triazine (trade name, Zisnet F manufactured by SANKYO KASEI Co., Ltd.), 2-dibutylamino-4,6-dimercapto-s-triazine (trade name, Zisnet DB manufactured by SANKYO KASEI Co., Ltd.), 2-anilino-4,6-dimercapto-s-triazine (trade name, Zisnet AF manufactured by SANKYO KASEI Co., Ltd.), etc. may be cited.

Among other mercapto compounds, 2-mercaptobenzimidazole, 2-mercaptobenzoxazole, 2-mercaptobenzothiazole (trade name: Accel M manufactured by Kawaguchi Chemical Industry Co., Ltd.), 3-mercapto-4-methyl-4H-1,2,4-triazole, 5-methyl-1,3,4-thiadiazole-2-thiol, and 1-phenyl-5-mercapto-1H-tetrazole prove to be desirable.

The amount of the mercapto compound mentioned above to be incorporated in the composition is preferred to be not less than 0.01 part by weight and not more than 10.0 parts by weight, more preferably not less than 0.05 part by weight and not more than 5 parts by weight, based on 100 parts by weight of the aforementioned carboxyl group-containing resin. If the amount is less than 0.01 part by weight based on 100 parts by weight of the above-mentioned carboxyl group-containing resin, it will be hardly possible to find improvement in adhesiveness as an effect of the addition of the mercapto compound. Conversely, if the amount exceeds 10.0 parts by weight, undesirably there is a possibility of causing inferior development and a reduced drying management range of the photocurable resin composition. These mercapto compounds may be used either singly or in the form of a combination of two or more members.

A thermosetting component may be added to the photosensitive resin composition to be used in the present invention. It has been confirmed that resistance to heat is improved by the addition of a thermosetting component. As the thermosetting component to be used in the present invention, any known thermosetting resins, such as an amino resin like a melamine resin, a benzoguanamine resin, melamine derivatives, and benzoguanamine derivatives, a blocked isocyanate compound, a cyclocarbonate compound, a polyfunctional epoxy compound, a polyfunctional oxetane compound, an episulfide resin, a bismaleimide, a carbodiimide resin, etc. may be used. Among other thermosetting components, the thermosetting components having a plurality of cyclic ether groups and/or cyclic thioether groups (hereinafter briefly referred to as cyclic (thio)ether groups) in its molecule prove to be desirable.

The thermosetting component having a plurality of cyclic (thio)ether groups in its molecule as mentioned above is a compound having a plurality of either one or two kinds of 3-, 4- or 5-membered cyclic (thio)ether groups in its molecule. For example, a compound having a plurality of epoxy groups in its molecule, i.e. a polyfunctional epoxy compound, a compound having a plurality of oxetanyl groups in its molecule, i.e. a polyfunctional oxetane compound, a compound having a plurality of thioether groups in its molecule, i.e. an episulfide resin may be cited.

As the polyfunctional epoxy compounds, for example, epoxidized vegetable oils represented by ADEKA CIZER O-130P, ADEKA CIZER O-180A, ADEKA CIZER D-32, and ADEKA CIZER D-55 manufactured by ADEKA CORPORATION; bisphenol A type epoxy resins represented by jER (registered trademark) 828, jER 834, jER 1001, and jER 1004 manufactured by Japan Epoxy Resin K.K., EHPE3150 manufactured by Daicel Corporation, EPICLON (registered trademark) 840, EPICLON 850, EPICLON 1050, and EPICLON 2055 manufactured by DIC Corporation, Epo Tohto (registered trademark) YD-011, YD-013, YD-127, and YD-128 manufactured by Tohto Kasei Co., Ltd., D.E.R. 317, D.E.R. 331, D.E.R. 661, and D.E.R. 664 manufactured by The Dow Chemical Company, ARALDITE 6071, ARALDITE 6084, ARALDITE GY250, and ARALDITE GY260 manufactured by Ciba Japan Ltd., Sumi-epoxy ESA-011, ESA-014, ELA-115, and ELA-128 manufactured by Sumitomo Chemical Co., Ltd., and A.E.R. 330, A.E.R. 331, A.E.R. 661, and A.E.R. 664 manufactured by Asahi Chemical Industry Co., Ltd. (all trade names); hydroquinone type epoxy resins represented by YDC-1312, bisphenol type epoxy resins represented by YSLV-80XY, and thioether type epoxy resins represented by YSLV-120TE (all manufactured by Tohto Kasei Co., Ltd.); brominated epoxy resins represented by jER YL903 manufactured by Japan Epoxy Resin K.K., EPICLON 152 and EPICLON 165 manufactured by DIC Corporation, Epo Tohto YDB-400 and YDB-500 manufactured by Tohto Kasei Co., Ltd., D.E.R. 542 manufactured by The Dow Chemical Company, ARALDITE 8011 manufactured by Ciba Japan Ltd., Sumi-epoxy ESB-400 and ESB-700 manufactured by Sumitomo Chemical Co., Ltd., and A.E.R. 711 and A.E.R. 714 manufactured by Asahi Chemical Industry Co., Ltd. (all trade names); novolak type epoxy resins represented by jER 152 and jER 154 manufactured by Japan Epoxy Resin K.K., D.E.N. 431 and D.E.N. 438 manufactured by The Dow Chemical Company, EPICLON N-730, EPICLON N-770, and EPICLON N-865 manufactured by DIC Corporation, Epo Tohto YDCN-701 and YDCN-704 manufactured by Tohto Kasei Co., Ltd., ARALDITE ECN1235, ARALDITE ECN1273, ARALDITE ECN1299, and ARALDITE XPY307 manufactured by Ciba Japan Ltd., EPPN (registered trademark)-201, EOCN (registered trademark)-1025, EOCN-1020, EOCN-104S, and RE-306 manufactured by Nippon Kayaku Co., Ltd., Sumi-epoxy ESCN-195X and ESCN-220 manufactured by Sumitomo Chemical Co., Ltd., and A.E.R. ECN-235 and ECN-299 manufactured by Asahi Chemical Industry Co., Ltd. (all trade names); biphenol novolak type epoxy resins represented by NC-3000 and NC-3100 manufactured by Nippon Kayaku Co., Ltd.; bisphenol F type epoxy resins represented by EPICLON 830 manufactured by DIC Corporation, jER 807 manufactured by Japan Epoxy Resin K.K., Epo Tohto YDF-170, YDF-175, and YDF-2004 manufactured by Tohto Kasei Co., Ltd., and ARALDITE XPY306 manufactured by Ciba Japan Ltd. (all trade names); hydrogenated bisphenol A type epoxy resins represented by Epo Tohto ST-2004, ST-2007, and ST-3000 manufactured by Tohto Kasei Co., Ltd. (all trade names); glycidylamine type epoxy resins represented by jER 604 manufactured by Japan Epoxy Resin K.K., Epo Tohto YH-434 manufactured by Tohto Kasei Co., Ltd., ARALDITE MY720 manufactured by Ciba Japan Ltd., and Sumi-epoxy ELM-120 manufactured by Sumitomo Chemical Co., Ltd. (all trade names); hydantoin type epoxy resins represented by ARALDITE CY-350 manufactured by Ciba Japan Ltd. (trade name); alicyclic epoxy resins represented by Celloxide (registered trademark) 2021 manufactured by Daicel Corporation, and ARALDITE CY175 and CY179 manufactured by Ciba Japan Ltd. (all trade names); trihydroxyphenyl methane type epoxy resins represented by YL-933 manufactured by Japan Epoxy Resin K.K., T.E.N. manufactured by The Dow Chemical Company, and EPPN-501 and EPPN-502 manufactured by Nippon Kayaku Co., Ltd. (all trade names); bixylenol type or biphenol type epoxy resins or mixtures thereof represented by YL-6056, YX-4000, and YL-6121 manufactured by Japan Epoxy Resin K.K. (all trade names); bisphenol S type epoxy resins represented by EBPS-200 manufactured by Nippon Kayaku Co., Ltd., EPX-30 manufactured by ADEKA CORPORATION, and EXA-1514 manufactured by DIC Corporation (all trade names); bisphenol A novolak type epoxy resins represented by jER 157S (trade name) manufactured by Japan Epoxy Resin K.K.; tetraphenylol ethane type epoxy resins represented by jER YL-931 manufactured by Japan Epoxy Resin K.K., and ARALDITE 163 manufactured by Ciba Japan Ltd. (all trade names); heterocyclic epoxy resins represented by ARALDITE PT810 (trade name) manufactured by Ciba Japan Ltd. and TEPIC (registered trademark) manufactured by Nissan Chemical Industries Ltd.; diglycidyl phthalate resin represented by BLEMMER (registered trademark) DGT manufactured by Nippon Oil and Fats Co., Ltd.; tetraglycidyl xylenoyl ethane resins represented by ZX-1063 (trade name) manufactured by Tohto Kasei Co., Ltd.; naphthalene group-containing epoxy resins represented by ESN-190 and ESN-360 manufactured by Shinnittetsu Chemical Co., Ltd. and HP-4032, EXA-4750, and EXA-4700 manufactured by DIC Corporation (all trade names); dicyclopentadiene skeleton-containing epoxy resins represented by HP-7200 and HP-7200H manufactured by DIC Corporation (all trade names); glycidylmethacrylate copolymer type epoxy resins represented by CP-50S and CP-50M manufactured by Nippon Oil and Fats Co., Ltd. (all trade names); copolymeric epoxy resin of cyclohexylmaleimide and glycidyl methacrylate; epoxy-modified polybutadiene rubber derivatives (for example, PB-3600 manufactured by Daicel Corporation), and CTBN-modified epoxy resins (for example, YR-102 and YR-450 manufactured by Tohto Kasei Co., Ltd.) may be cited, but are not limited to these epoxy resins. These epoxy resins may be used either singly or in the form of a combination of two or more members. Among other epoxy resins cited above, novolak type epoxy resins, bixylenol type epoxy resins, biphenol type epoxy resins, biphenol novolak type epoxy resins or mixtures thereof prove to be particularly desirable.

As the polyfunctional oxetane compounds, for example, bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl) methyl acrylate, (3-ethyl-3-oxetanyl)methyl acrylate, (3-methyl-3-oxetanyl)methyl methacrylate, (3-ethyl-3-oxetanyl)methyl methacrylate, their oligomers or copolymers, and etherified products of an oxetane alcohol with a hydroxyl group-containing resin, such as a novolak resin, poly(p-hydroxystyrene), cardo type bisphenols, calixarenes, calixresorcinarenes, or silsesquioxane, may be cited. Besides, copolymers of an unsaturated monomer having an oxetane ring with an alkyl (meth)acrylate may be cited.

As the aforementioned episulfide compounds having a plurality of cyclic thioether groups in its molecule, for example, a bisphenol A type episulfide resin, YL7000 manufactured by Japan Epoxy Resin K.K. etc. may be cited. Further, an episulfide resin containing a sulfur atom in place of an oxygen atom of an epoxy group of a novolak type epoxy resin obtained by the similar synthetic method may be used.

The amount of the thermosetting component having a plurality of cyclic (thio)ether groups in its molecule to be incorporated in the composition is preferred to be in the range of 0.6 to 2.5 equivalent weights per one equivalent weight of the carboxyl group of the carboxyl group-containing resin mentioned above. If the amount of the thermosetting component having a plurality of cyclic (thio)ether groups in its molecule is less than 0.6 equivalent weight per one equivalent weight of the carboxyl group of the carboxyl group-containing resin, the carboxyl group will remain in a solder resist film so that the resistance to heat, the resistance to alkalis, the electrical insulating properties, etc. of the film will be deteriorated. Conversely, if the amount of the thermosetting component exceeds 2.5 equivalent weights per one equivalent weight of the carboxyl group of the carboxyl group-containing resin, the cyclic (thio)ether group of a low molecular weight will remain in a dried coating film so that the strength of the coating film will be deteriorated. The more preferred amount is 0.8 to 2.0 equivalent weights per one equivalent weight of the carboxyl group of the carboxyl group-containing resin mentioned above.

As other thermosetting components, amino resins such as a melamine derivative and a benzoguanamine derivative may be cited. For example, a methylol melamine compound, a methylol benzoguanamine compound, a methylol glycoluryl compound, a methylol urea compound, etc. may be cited. Further, an alkoxymethylated melamine compound, an alkoxymethylated benzoguanamine compound, an alkoxymethylated glycoluryl compound, and an alkoxymethylated urea compound are obtained by converting the methylol group of each of the methylol melamine compound, the methylol benzoguanamine compound, the methylol glycoluryl compound, and the methylol urea compound into an alkoxy methyl group, respectively. This alkoxy methyl group is not limited to a particular one and may be, for example, a methoxymethyl group, an ethoxymethyl group, a propoxymethyl group, a butoxymethyl group, etc. Particularly, a melamine derivative having the formalin concentration of not more than 0.2%, which is friendly to the human body and environment, prove to be desirable.

As commercially available products thereof, for example, Cymel (registered trademark) 300, Cymel 301, Cymel 303, Cymel 370, Cymel 325, Cymel 327, Cymel 701, Cymel 266, Cymel 267, Cymel 238, Cymel 1141, Cymel 272, Cymel 202, Cymel 1156, Cymel 1158, Cymel 1123, Cymel 1170, Cymel 1174, Cymel UFR65, and Cymel 300 (all manufactured by Mitsui-Cytec Ltd.), NIKALAC (registered trademark) Mx-750, NIKALAC Mx-032, NIKALAC Mx-270, NIKALAC Mx-280, NIKALAC Mx-290, NIKALAC Mx-706, NIKALAC Mx-708, NIKALAC Mx-40, NIKALAC Mx-31, NIKALAC Ms-11, NIKALAC Mw-30, NIKALAC Mw-30HM, NIKALAC Mw-390, NIKALAC Mw-100LM, and NIKALAC Mw-750LM (all manufactured by Sanwa Chemicals Co., Ltd.), etc. may be cited.

The above-mentioned thermosetting components may be used either singly or in the form of a combination of two or more members.

Further, a compound having a plurality of isocyanate groups or blocked isocyanate groups in its molecule may be added to the photosensitive resin composition to be used in the present invention. As such compounds having a plurality of isocyanate groups or blocked isocyanate groups in its molecule, a polyisocyanate compound, a blocked isocyanate compound, etc., may be cited. Incidentally, a blocked isocyanate group is a group which is temporarily inactivated by protecting the isocyanate group through the reaction with a blocking agent. When heated to a predetermined temperature, the blocking agent dissociates to produce an isocyanate group. It has been confirmed that the curing properties of the composition and the toughness of the resultant cured film are improved by addition of a polyisocyanate compound or a blocked isocyanate compound.

As the polyisocyanate compound mentioned above, for example, an aromatic polyisocyanate, an aliphatic polyisocyanate, or an alicyclic polyisocyanate is used.

As concrete examples of the aromatic polyisocyanate, 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate, and 2,4-tolylene dimer may be cited.

As concrete examples of the aliphatic polyisocyanate, tetramethylene diisocyanate, hexamethylene diisocyanate, methylene diisocyanate, trimethyl hexamethylene diisocyanate, 4,4-methylene-bis(cyclohexylisocyanate), and isophorone diisocyanate may be cited.

As concrete examples of the alicyclic polyisocyanate, bicycloheptane triisocyanate may be cited. Further, adducts, biuret-modified products, and isocyanurate-modified products of the isocyanate compounds enumerated above may be cited.

As the blocked isocyanate compound, an addition reaction product of an isocyanate compound and an isocyanate blocking agent is used. As the isocyanate compound which can react with a blocking agent, the above-mentioned polyisocyanates etc. may be cited.

As the isocyanate blocking agent, for example, phenolic blocking agents, such as phenol, cresol, xylenol, chlorophenol, and ethylphenol; lactam-based blocking agents such as ε-caprolactam, δ-valerolactam, γ-butyrolactam, and β-propiolactam; active methylene-based blocking agents such as ethyl acetoacetate and acetylacetones; alcohol-based blocking agents such as methanol, ethanol, propanol, butanol, amyl alcohol, ethylene glycol monomethyl ether, ethylene glycol monoethyl ether, ethylene glycol monobutyl ether, diethylene glycol monomethyl ether, propylene glycol monomethyl ether, benzyl ether, methyl glycolate, butyl glycolate, diacetone alcohol, methyl lactate, and ethyl lactate; oxime-based blocking agents such as formaldehydoxime, acetaldoxime, acetoxime, methylethyl ketoxime, diacetylmonoxime, and cyclohexane oxime; mercaptan-based blocking agents such as butyl mercaptan, hexyl mercaptan, t-butyl mercaptan, thiophenol, methylthiophenol, and ethylthiophenol; acid amide-based blocking agent such as acetic amide and benzamide; imide-based blocking agents such as succinic imide and maleic imide; amine-based blocking agents such as xylidine, aniline, butylamine, and dibutylamine; imidazole-based blocking agents such as imidazole and 2-ethylimidazole; and imine-based blocking agents such as methylene imine and propylene imine may be cited.

As the blocked isocyanate compounds, commercially available products may be used. For example, Sumidur (registered trademark) BL-3175, BL-4165, BL-1100, and BL-1265, Desmodur (registered trademark) TPLS-2957, TPLS-2062, TPLS-2078, and TPLS-2117, Desmotherm (registered trademark) 2170, and Desmotherm 2265 (all manufactured by Sumitomo Beyer urethane Co., Ltd.), CORONATE (registered trademark) 2512, CORONATE 2513, and CORONATE 2520 (all manufactured by Nippon Polyurethane Industry Co., Ltd.), B-830, B-815, B-846, B-870, B-874, and B-882 (all manufactured by Mitsui Takeda Chemicals Inc.), TPA-B80E, 17B-60PX, and E402-B80T (all manufactured by Asahi Kasei Chemicals Corporation) may be cited. Incidentally, Sumidur BL-3175 and BL-4265 are obtained using methylethyl oxime as a blocking agent. The above-mentioned compounds having a plurality of isocyanate groups or blocked isocyanate groups in its molecule may be used either singly or in the form of a combination of two or more members.

The amount of such a compound having a plurality of isocyanate groups or blocked isocyanate groups in its molecule to be incorporated in the composition is preferred to be in the range of 1 to 100 parts by weight, based on 100 parts by weight of the aforementioned carboxyl group-containing resin. If the amount is less than 1 part by weight based on 100 parts by weight of the above-mentioned carboxyl group-containing resin, the sufficient toughness of a cured film will not be attained. Conversely, if the amount exceeds 100 parts by weight, the composition will be at a disadvantage in acquiring inferior storage stability. The more preferred amount is 2 to 70 parts by weight, based on 100 parts by weight of the aforementioned carboxyl group-containing resin.

When the thermosetting component having a plurality of cyclic (thio)ether groups in its molecule is used, it is preferable that the composition should contain a thermosetting catalyst. As such thermosetting catalysts, for example, imidazole and imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine; hydrazine compounds such as dihydrazide adipate and dihydrazide sebacate; and phosphorus compounds such as triphenylphosphine may be cited. As the commercially available thermosetting catalysts, for example, products of Shikoku Chemicals Co., Ltd.; 2MZ-A, 2MZ-OK, 2PHZ, 2P4BHZ, and 2P4MHZ (invariably trade names for imidazole type compounds), and products of Sun-Apro K.K.; U-CAT (registered trademark) 3503N and U-CAT3502T (invariably trade names for isocyanate compounds blocked with dimethyl amine) and DBU, DBN, U-CATSA102, and U-CAT5002 (invariably trade names for dicyclic amizine compounds and salts thereof) may be cited. The thermosetting catalyst is not limited to the compounds cited above. Any thermosetting catalysts for an epoxy resin and an oxetane compound or any compounds which can promote the reaction of an epoxy group and/or an oxetanyl group with a carboxyl group may be used either singly or in the form of a mixture of two or more members. Furthermore, S-triazine derivatives such as guanamine, acetoguanamine, benzoguanamine, melamine, 2,4-diamino-6-methacryloyloxyethyl-S-triazine, 2-vinyl-4,6-diamino-S-triazine, isocyanuric acid adduct of 2-vinyl-4,6-diamino-S-triazine, isocyanuric acid adduct of 2,4-diamino-6-methacryloyloxyethyl-S-triazine may also be used. Preferably, these compounds which also function as an adhesiveness-imparting agent are used in combination with the thermosetting catalyst mentioned above.

The amount of the thermosetting catalyst to be incorporated in the composition may be sufficient in the conventionally used range, for example, preferably in the range of 0.1 to 20 parts by weight, more preferably 0.5 to 15.0 parts by weight, based on 100 parts by weight of the above-mentioned carboxyl group-containing resin or the thermosetting component having a plurality of cyclic (thio)ether groups in its molecule.

The photosensitive resin composition to be used in the present invention may further incorporate a colorant therein. As the colorant, known and commonly used coloring agents of red, blue, green, yellow, etc. may be used and any of pigments, dyes and dyestuff may be sufficient. As concrete examples, those having the following Color Index (C.I.; issued by The Society of Dyers and Colourists) numbers may be cited. However, it is preferred that they do not contain halogen from the viewpoint of reducing impact on the environment and influence on the human body.

Red Colorant:

As the red colorant, there are a monoazo type, a disazo type, an azo rake type, a benzimidazolone type, a perylene type, a diketo-pyrrolo-pyrrole type, a condensation azo type, an anthraquinone type, a quinacridone type, etc. As concrete examples, the following colorants may be cited.

Monoazo type: Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, and 269.

Disazo type: Pigment Red 37, 38, and 41.

Monoazo rake type: Pigment Red 48:1, 48:2, 48:3, 48:4, 49:1, 49:2, 50:1, 52:1, 52:2, 53:1, 53:2, 57:1, 58:4, 63:1, 63:2, 64:1, and 68.

Benzimidazolone type: Pigment Red 171, Pigment Red 175, Pigment Red 176, Pigment Red 185, and Pigment Red 208.

Perylene type: Solvent Red 135, Solvent Red 179, Pigment Red 123, Pigment Red 149, Pigment Red 166, Pigment Red 178, Pigment Red 179, Pigment Red 190, Pigment Red 194, and Pigment Red 224.

Diketo-pyrrolo-pyrrole type: Pigment Red 254, Pigment Red 255, Pigment Red 264, Pigment Red 270, and Pigment Red 272.

Condensation azo type: Pigment Red 220, Pigment Red 144, Pigment Red 166, Pigment Red 214, Pigment Red 220, Pigment Red 221, and Pigment Red 242.

Anthraquinone type: Pigment Red 168, Pigment Red 177, Pigment Red 216, Solvent Red 149, Solvent Red 150, Solvent Red 52, and Solvent Red 207.

Quinacridone type: Pigment Red 122, Pigment Red 202, Pigment Red 206, Pigment Red 207, and Pigment Red 209.

Blue Colorant:

As the blue colorant, there are a phthalocyanine type and an anthraquinone type. As the pigment type thereof, the compounds which are classified into a pigment, concretely, Pigment Blue 15, Pigment Blue 15:1, Pigment Blue 15:2, Pigment Blue 15:3, Pigment Blue 15:4, Pigment Blue 15:6, Pigment Blue 16, and Pigment Blue 60 may be cited.

As the dye type, Solvent Blue 35, Solvent Blue 63, Solvent Blue 68, Solvent Blue 70, Solvent Blue 83, Solvent Blue 87, Solvent Blue 94, Solvent Blue 97, Solvent Blue 122, Solvent Blue 136, Solvent Blue 67, Solvent Blue 70, etc. may be used. Besides the compounds mentioned above, a phthalocyanine compound which is substituted or not substituted by metal may also be used.

Green Colorant:

As the green colorant, similarly there are a phthalocyanine type, an anthraquinone type, and a perylene type. Specifically, Pigment Green 7, Pigment Green 36, Solvent Green 3, Solvent Green 5, Solvent Green 20, Solvent Green 28, etc. may be used. Besides the compounds mentioned above, a phthalocyanine compound which is substituted or not substituted by metal may also be used.

Yellow Colorant:

As the yellow colorant, there are a monoazo type, a disazo type, a condensation azo type, a benzimidazolone type, an isoindolinone type, an anthraquinone type, etc., and the following are specifically cited.

Anthraquinone type: Solvent Yellow 163, Pigment Yellow 24, Pigment Yellow 108, Pigment Yellow 193, Pigment Yellow 147, Pigment Yellow 199, and Pigment Yellow 202.

Isoindolinone type: Pigment Yellow 110, Pigment Yellow 109, Pigment Yellow 139, Pigment Yellow 179, and Pigment Yellow 185.

Condensation azo type: Pigment Yellow 93, Pigment Yellow 94, Pigment Yellow 95, Pigment Yellow 128, Pigment Yellow 155, Pigment Yellow 166, and Pigment Yellow 180.

Benzimidazolone type: Pigment Yellow 120, Pigment Yellow 151, Pigment Yellow 154, Pigment Yellow 156, Pigment Yellow 175, and Pigment Yellow 181.

Monoazo type: Pigment Yellow 1, 2, 3, 4, 5, 6, 9, 10, 12, 61, 62, 62:1, 65, 73, 74, 75, 97, 100, 104, 105, 111, 116, 167, 168, 169, 182, and 183.

Disazo type: Pigment Yellow 12, 13, 14, 16, 17, 55, 63, 81, 83, 87, 126, 127, 152, 170, 172, 174, 176, 188, and 198.

In addition, any coloring agents of purple, orange, brown, black, etc. may be added to the composition for the purpose of adjusting a color tone.

As concrete examples thereof, Pigment Violet 19, 23, 29, 32, 36, 38, and 42, Solvent Violet 13 and 36, C.I. Pigment Orange 1, C.I. Pigment Orange 5, C.I. Pigment Orange 13, C.I. Pigment Orange 14, C.I. Pigment Orange 16, C.I. Pigment Orange 17, C.I. Pigment Orange 24, C.I. Pigment Orange 34, C.I. Pigment Orange 36, C.I. Pigment Orange 38, C.I. Pigment Orange 40, C.I. Pigment Orange 43, C.I. Pigment Orange 46, C.I. Pigment Orange 49, C.I. Pigment Orange 51, C.I. Pigment Orange 61, C.I. Pigment Orange 63, C.I. Pigment Orange 64, C.I. Pigment Orange 71, C.I. Pigment Orange 73, C.I. Pigment Brown 23, C.I. Pigment Brown 25, C.I. Pigment Black 1, C.I. Pigment Black 7, etc. may be cited.

The above-mentioned colorant may be incorporated in the composition in a suitably amount, but it is preferred to be not more than 10 parts by weight, based on 100 parts by weight of the aforementioned carboxyl group-containing resin. The more preferred amount is 0.1 to 5 parts by weight, based on 100 parts by weight of the aforementioned carboxyl group-containing resin.

The photosensitive resin composition to be used in the present invention may contain a compound which has a plurality of ethylenically unsaturated groups in its molecule. The compound having a plurality of ethylenically unsaturated groups is capable of curing by irradiation with an active energy ray and insolubilizing the carboxyl group-containing resin of the present invention in an aqueous alkali solution or assisting the insolubilization. As such compounds, commonly used and known polyester (meth)acrylates, polyether (meth)acrylates, urethane (meth)acrylates, carbonate (meth)acrylates, epoxy (meth)acrylates, etc., may be used. As concrete examples thereof, hydroxyalkyl acrylates such as 2-hydroxyethyl acrylate and 2-hydroxypropyl acrylate; di-acrylates of glycols such as ethylene glycol, methoxytetraethylene glycol, polyethylene glycol, and propylene glycol; acrylamides such as N,N-dimethyl acrylamide, N-methylol acrylamide, and N,N-dimethylaminopropyl acrylamide; aminoalkyl acrylates such as N,N-dimethylaminoethyl acrylate and N,N-dimethylaminopropyl acrylate; polyfunctional acrylates of polyhydric alcohols, such as hexane diol, trimethylol propane, pentaerythritol, dipentaerythritol, and tris-hydroxyethyl isocyanurate, and ethylene oxide adducts, propylene oxide adducts or c-caprolactone adducts of these polyhydric alcohols; polyfunctional acrylates of phenols and ethylene oxide adducts or propylene oxide adducts of phenols such as phenoxy acrylate and bisphenol A diacrylate; polyfunctional acrylates of glycidyl ethers such as glycerin diglycidyl ether, glycerin triglycidyl ether, trimethylol propane triglycidyl ether, and triglycidyl isocyanurate; acrylates obtained by directly acrylating or urethane-acrylating via a diisocyanate a polyol such as polyether polyol, polycarbonatediol, hydroxyl group-terminated polybutadiene, and polyester polyol; melamine acrylate, and/or methacrylates corresponding to the acrylates enumerated above may be cited.

Further, an epoxy acrylate resin obtained by the reaction of a polyfunctional epoxy resin such as a cresol novolak type epoxy resin with acrylic acid, an epoxy urethane acrylate compound obtained by causing a half urethane compound of a hydroxyl acrylate such as pentaerythritol triacrylate and a diisocyanate such as isophorone diisocyanate to react with the hydroxyl group of the epoxy acrylate resin mentioned above, or the like may be cited. Such an epoxy acrylate type resin is capable of improving the photo-curing properties, without deteriorating the tack-free touch of finger of a dried coating film.

These compounds having a plurality of ethylenically unsaturated groups in its molecule may be used either singly or in the form of a mixture of two or more members. Particularly, the compounds having 4 to 6 ethylenically unsaturated groups in its molecule prove to be preferable from the viewpoint of their photo-curing properties and resolution. Further, it has been found that the use of a compound having two ethylenically unsaturated groups in its molecule is advantageous because the linear thermal expansion coefficient of a cured product is lowered and the occurrence of peeling during the PCT is reduced.

The amount of such a compound having a plurality of ethylenically unsaturated groups in its molecule to be incorporated in the composition is desired to be in the range of 5 to 100 parts by weight, based on 100 parts by weight of the carboxyl group-containing resin mentioned above. If the amount of the compound is less than 5 parts by weight based on 100 parts by weight of the above-mentioned carboxyl group-containing resin, the photo-curing properties of the resultant photosensitive resin composition will become inferior, and after irradiation with an active energy ray, it will be difficult to complete the pattern formation with an alkali development. Conversely, if the amount exceeds 100 parts by weight, the solubility of the composition in an aqueous alkaline solution will become inferior and a coating film will become brittle. The more preferred amount is 1 to 70 parts by weight, based on 100 parts by weight of the aforementioned carboxyl group-containing resin.

The photosensitive resin composition of the present invention may use an organic solvent for the synthesis of the above-mentioned carboxyl group-containing resin or preparation of the composition or for the purpose of adjusting the viscosity of the composition to a level suitable for application to a substrate or a carrier film.

As such organic solvents, for example, ketones, aromatic hydrocarbons, glycol ethers, glycol ether acetates, esters, alcohols, aliphatic hydrocarbons, and petroleum solvents may be cited. As concrete examples thereof, ketones such as methylethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; esters such as ethyl acetate, butyl acetate, dipropylene glycol methyl ether acetate, propylene glycol methyl ether acetate, propylene glycol ethyl ether acetate, and propylene glycol butyl ether acetate; alcohols such as ethanol, propanol, ethylene glycol, and propylene glycol; aliphatic hydrocarbons such as octane and decane; and petroleum solvents such as petroleum ether, petroleum naphtha, hydrogenated petroleum naphtha, and solvent naphtha may be cited.

These organic solvents may be used either singly or in the form of a mixture of two or more members.

The photosensitive resin composition to be used in the present invention, for the purpose of preventing oxidation, may further incorporate therein antioxidants, such as (1) a radical scavenger which can nullify the generated radicals or/and (2) a peroxide decomposer which decomposes the generated peroxides into a harmless substance and inhibits the generation of new radicals.

As the antioxidant which functions as a radical scavenger, for example, phenol-based compounds, such as hydroquinone, 4-t-butyl catechol, 2-t-butylhydroquinone, hydroquinone monomethyl ether, 2,6-di-t-butyl-p-cresol, 2,2-methylene-bis(4-methyl-6-t-butylphenol), 1,1,3-tris(2-methyl-4-hydroxy-5-t-buthylphenyl)butane, 1,3,5-trimethyl-2,4,6-tris(3,5-di-t-butyl-4-hydroxybenzyl)benzene, and 1,3,5-tris(3',5'-di-t-butyl-4-hydroxybenzyl)-S-triazine-2,4,6-(1H,3H, 5H)trione, quinine-based compounds, such as methoquinone and benzoquinone, and amine compounds, such as bis(2,2,6, 6-tetramethyl-4-piperidyl)-sebacate and phenothiazin, etc. may be cited.

The radical scavenger may be commercially available products and, for example, ADEKA STAB (registered trademark) AO-30, ADEKA STAB AO-330, ADEKA STAB AO-20, ADEKA STAB LA-77, ADEKA STAB LA-57, ADEKA STAB LA-67, ADEKA STAB LA-68, and ADEKA STAB LA-87 (all manufactured by ADEKA Corporation), IRGANOX (registered trademark) 1010, IRGANOX 1035, IRGANOX 1076, IRGANOX 1135, TINUVIN (registered trademark) 111FDL, TINUVIN 123, TINUVIN 144, TINUVIN 152, TINUVIN 292, and TINUVIN 5100 (all manufactured by Ciba Japan Ltd.), etc. may be cited.

As the antioxidant which functions as a peroxide decomposer, for example, sulfur-based compounds such as triphenyl phosphite, and phosphorus-based compounds such as pentaerythritol tetralaurylthiopropionate, dilauryl thiodipropionate, distearyl 3,3'-thiodipropionate, etc. may be cited.

The peroxide decomposer may be commercially available products and, for example, ADEKA STAB TPP (manufactured by ADEKA Corporation), MARK AO-4125 (manufactured by Adeka Argus Chemical Co., Ltd.), SUMILIZER (registered trademark) TPS (manufactured by Sumitomo Chemical Co., Ltd.), etc. may be cited.

The antioxidants mentioned above may be used either singly or in the form of a combination of two or more members.

The photosensitive resin composition to be used in the present invention may use an ultraviolet light absorber other than the above-mentioned antioxidant.

As the ultraviolet light absorber, benzophenone derivatives, benzoate derivatives, benzotriazole derivatives, triazine derivatives, benzothiazole derivatives, cinnamate derivatives, anthranilate derivatives, dibenzoylmethane derivatives, etc. may be cited.

As the benzophenone derivatives, for example, 2-hydroxy-4-methoxybenzophenone, 2-hydroxy-4-n-octoxybenzophenone, 2,2'-dihydroxy-4-methoxybenzophenone, 2,4-dihydroxybenzophenone, etc. may be cited.

As the benzoate derivatives, for example, 2-ethylhexyl salicylate, phenyl salicylate, p-t-butylphenyl salicylate, 2,4-di-t-buthylphenyl-3,5-di-t-butyl-4-hydroxy benzoate, hexadecyl-3,5-di-t-butyl-4-hydroxy benzoate, etc. may be cited.

As the benzotriazole derivatives, for example, 2-(2'-hydroxy-5'-t-buthylphenyl)benzotriazol, 2-(2'-hydroxy-5'-methylphenyl)benzotriazol, 2-(2'-hydroxy-3'-t-butyl-5'-methylphenyl)-5-chlorobenzotriazole, 2-(2'-hydroxy-3',5'-di-t-buthylphenyl)-5-chlorobenzotriazole, 2-(2'-hydroxy-5'-methylphenyl)benzotriazol, 2-(2'-hydroxy-3',5'-di-t-amylphenyl)benzotriazol, etc. may be cited.

As the triazine derivatives, for example, hydroxyphenyl triazine, bisethylhexyloxyphenol methoxypheny triazine, etc. may be cited.

The ultraviolet light absorber may be commercial available products, and for example, TINUVIN PS, TINUVIN 99-2, TINUVIN 109, TINUVIN 384-2, TINUVIN 900, TINUVIN 928, TINUVIN 1130, TINUVIN 400, TINUVIN 405, TINUVIN 460, TINUVIN 479 (all manufactured by Ciba Japan Ltd.), etc. may be cited.

The above-mentioned ultraviolet light absorbers may be used either singly or in the form of a combination of two or more members to stabilize the molded product obtained from the photosensitive resin composition of the present invention by using together with the antioxidant.

The photosensitive resin composition to be used in the present invention may further incorporate therein, as occasion demands, a known thermal polymerization inhibitor, a thixotropic agent, such as finely powdered silica, organobentonite, and montmorillonite, a silicone type, fluorine type, or macromolecular type anti-foaming agent and/or leveling agent, a silane coupling agent of the imidazole type, thiazole type, triazole type, etc., and known additives, such as an antioxidant and a rust preventive.

The thermal polymerization inhibitor can be used for the purpose of preventing the thermal polymerization or the polymerization with time of a polymerizable compound. As the thermal polymerization inhibitor, for example 4-methoxyphenol, hydroquinone, alkyl- or aryl-substituted hydroquinone, t-butylcatechol, pyrogallol, 2-hydroxybenzophenone, 4-methoxy-2-hydroxybenzophenone, cuprous chloride, phenothiazin, chloranil, naphthylamine, β-naphthol, 2,6-di-t-butyl-4-cresol, 2,2'-methylenebis(4-methyl-6-t-butylphenol), pyridine, nitrobenzene, dinitrobenzene, picric acid, 4-toluidine, methylene blue, a reaction product of copper and an organic-chelating agent, methyl salicylate, phenothiazin, a nitroso compound, a chelate of a nitroso compound and aluminum, etc. may be cited.

In the photosensitive resin composition to be used in the present invention, an adhesiveness-imparting agent may be used for the purpose of improving the adhesion between layers or the adhesion between a resin insulation layer formed and a substrate. Particularly, it has been found that when the adhesiveness-imparting agent is added to the first photosensitive resin layer (L1) contacting a substrate, it is possible to suppress the separation of the photosensitive resin layer at the time of PCT. As such adhesiveness-imparting agents, for example, benzimidazole, benzoxazole, benzothiazole, 3-morpholinomethyl-1-phenyl-triazole-2-thione, 5-amino-3-morpholinomethyl-thiazole-2-thione, triazole, tetrazole, benzotriazol, carboxybenzotriazol, amino group-containing benzotriazol, silane coupling agent, etc. may be cited.

The photosensitive resin composition to be used in the present invention may incorporate therein a flame retardant. As the flame retardant, any commonly used and known phosphorus-containing compound, such as phosphinates, phosphoric ester derivatives, and phosphazene compounds, may be used. Although such a flame retardant may be added to any layers without causing any problem, it may be added to either one of the layers. The phosphorus element concentration is desired to be in the range of not exceeding 3% of all the layers.

In the layered structure of the present invention, the photosensitive resin layer may be formed by directly applying the photosensitive resin composition to a substrate by a method as described hereinbefore and drying it. Alternatively, a photosensitive dry film may be prepared in advance by uniformly applying the photosensitive resin composition to a carrier film by a suitable method using a blade coater, a lip coater, a comma coater, a film coater, etc., then drying it to form the photosensitive resin layer having a content profile of the inorganic filler mentioned above, and preferably laminating a cover film thereon. In this case, after removal of one of the films (the cover film or the carrier film), the photosensitive resin layer may be formed by superposing this photosensitive dry film on a substrate so that the surface side in which the inorganic filler content is low is brought into contact with the substrate and laminating it on the substrate using a laminator etc. Incidentally, in the case of the photosensitive dry film of the two-layer structure as shown in FIG. 2, for example, the first photosensitive resin layer (L1) which does not contain an inorganic filler or has the lower inorganic filler content and the second photosensitive resin layer (L2) having the higher inorganic filler content may be formed on the carrier film in this order, or the second photosensitive resin layer (L2) and the first photosensitive resin layer (L1) may be formed on the carrier film in this order. When the photosensitive dry film is laminated on the substrate, it is just required to remove the film on the side of the first photosensitive resin layer (L1) which does not contain an inorganic filler or has the lower inorganic filler content and laminate the photosensitive dry film on the substrate so that its side is brought into contact with the substrate. The remained other film (the carrier film or the cover film) may be separated from the laminated photosensitive dry film before or after the exposure to light to be described hereinafter. These steps may be also applied to the case of the multilayer structure of more than two layers.

The total thickness of the photosensitive resin layers is preferred to be not more than 100 μm. In the case of two-layer structure as shown in FIG. 2, for example, the first photosensitive resin layer (L1) which has the lower inorganic filler content or does not contain an inorganic filler is preferred to have the thickness of 1 to 50 μm and the second photosensitive resin layer (L2) having the higher inorganic filler content is preferred to have the thickness of 1 to 50 μm. All photosensitive resin layers are preferred to have the thickness of 5 to 50 μm, and the ratio of the first photosensitive layer (L1) to the second photosensitive resin layer (L2) is preferred to be in range of 1:9 to 9:1. When the thickness of the first photosensitive resin layer (L1) is matched to or thicker than the thickness of a circuit on the substrate to be laminated by several micrometers, good PCT resistance and good surface smoothness may be advantageously obtained because all the circuits are covered with the first photosensitive resin layer (L1) which exhibits good mobility and good adhesiveness. Incidentally, in the case of the multilayer structure more than two layers, the thickness of each layer may be the same or different from each other. However, it is preferable that each layer should have the same thickness because the content profile of the inorganic filler may be easily designed.

As the carrier film, a thermoplastic film, such as a polyester film like a polyethylene terephthalate of 2 to 150 μm thickness, for example, is used.

As the cover film, a polyethylene film, a polypropylene film, etc. can be used, but any cover film may be advantageously used provided that its adhesive strength to a solder resist layer is smaller than that of the carrier film to the solder resist layer.

As the substrate mentioned above, besides printed wiring boards having a prescribed pattern formed in advance thereon and flexible printed wiring boards, copper-clad laminates of all grades (FR-4 etc.) using composite materials, such as a paper-phenol resin composite material, a paper-epoxy resin composite material, a glass cloth-epoxy resin composite material, a glass-polyimide composite material, a glass cloth/nonwoven fabric-epoxy resin composite material, a glass cloth/paper-epoxy resin composite material, a synthetic fiber-epoxy resin composite material, and a fluoroplastic-polyethylene-PPO-cyanate ester composite material, and a polyimide film, a PET film, a glass substrate, a ceramic substrate, a wafer substrate, etc. may be used.

Next, the photosensitive resin layer formed on the substrate and having a content profile of the inorganic filler mentioned above is exposed to light by selectively exposing to an active energy ray through a photomask having a prescribed exposure pattern by a contact method (or a non-contact method) or directly exposed according to a prescribed pattern with a laser direct exposure machine. The exposed area (the area irradiated with the active energy ray) of the photosensitive resin layer cures.

As an exposure machine to be used for irradiation with the active energy ray mentioned above, direct imaging equipment (for example, laser direct imaging equipment which depicts an image directly by a laser with the CAD data from a computer), an exposure machine equipped with metal halide lamp(s), an exposure machine equipped with (ultra)high-pressure mercury vapor lamp(s), an exposure machine equipped with mercury short arc lamp(s), or direct imaging equipment equipped with ultraviolet light lamp(s) such as (ultra)high-pressure mercury vapor lamp(s) may be used.

As the activity energy ray, it is preferable that the laser beam having a maximum wavelength falling in the range of 350 nm to 410 nm be used. By setting the maximum wavelength in this range, it is possible to efficiently generate radicals from the photopolymerization initiator. Either of a gas laser and a solid-state laser may be used insofar as the laser beam having the maximum wavelength falling in this range is used. Although the exposure dose varies depending on the film thickness etc., it may be set generally in the range of 5 to 500 mJ/cm$^2$, preferably 10 to 300 mJ/cm$^2$.

As the above-mentioned direct imaging equipment, the products manufactured by Orbotech Japan Co., Ltd. or PENTAX CORPORATION, for example, may be used. Any equipment may be used insofar as it can emit the laser beam having the maximum wavelength in the range of 350 nm to 410 nm.

After the photosensitive resin layer is exposed to light as described above to cure the exposed area (the area irradiated with the active energy ray) thereof, the unexposed area thereof is developed with a dilute aqueous alkali solution (for example, an aqueous 0.3-3 wt. % sodium carbonate solution) to form a cured film layer (pattern).

As a developing method mentioned above, a dipping method, a shower method, a spraying method, a brushing method or the like may be adopted. As a developing solution, aqueous alkali solutions of potassium hydroxide, sodium hydroxide, sodium carbonate, potassium carbonate, sodium phosphate, sodium silicate, ammonia, amines, etc. may be used.

Further, in case the photosensitive resin layer contains a thermosetting component, when the resultant film is further thermally cured by heating to a temperature in the approximate range of 140° C. to 180° C., for example, the carboxyl group of the carboxyl group-containing resin reacts with the thermosetting component having a plurality of cyclic ether groups and/or cyclic thioether groups in its molecule, and thus a cured film layer (pattern) which excels in various properties such as resistance to heat, resistance to chemicals, resistance to moisture absorption, adhesiveness, and electrical properties can be obtained.

Now, the present invention will be more specifically described below with reference to working examples and comparative examples. However, it is needless to say that the present invention is not limited to the following examples. Wherever "parts" and "%" are mentioned hereinbelow, they invariably refer to those based on weight unless otherwise specified.

SYNTHESIS EXAMPLE 1

Into an autoclave equipped with a thermometer, a device for introduction of nitrogen and alkylene oxide, and a stirrer, 119.4 parts of a cresol novolak resin (trade name "Shonol CRG951" manufactured by Showa Highpolymer Co., Ltd., OH equivalent: 119.4), 1.19 parts of potassium hydroxide, and 119.4 parts of toluene were charged. The air in the system chamber was replaced with nitrogen while stirring the mixture. The temperature of the mixture was then increased by heating and then 63.8 parts of propylene oxide was gradually added dropwise thereto to cause reaction thereof for 16 hours at 125-132° C. under pressure of 0-4.8 kg/cm$^2$. Thereafter, the reaction solution was cooled to room temperature. To this reaction solution, 1.56 parts of 89% phosphoric acid was added and mixed therewith to neutralize potassium hydroxide, thereby obtaining a propylene oxide reaction solution of cresol novolak resin having a nonvolatile content of 62.1% and the hydroxyl equivalent of 182.2 g/eq. This means that 1.08 mols of the alkylene oxide was added to one equivalent of the phenolic hydroxyl group on average.

Into a reaction vessel equipped with a stirrer, a thermometer, and an air blowing tube, 293.0 parts of the alkylene oxide reaction solution of cresol novolak resin obtained as above, 43.2 parts of acrylic acid, 11.53 parts of methanesulfonic acid, 0.18 part of methylhydroquinone, and 252.9 parts of toluene were charged and left reacting for 12 hours at 110° C. while stirring and blowing air thereinto at the rate of 10 ml/minute. 12.6 parts of water caused by the reaction was distilled out together with toluene as an azeotropic mixture. Thereafter, the reaction solution was cooled to room temperature. The obtained reaction solution was neutralized with 35.35 parts of an aqueous 15% sodium hydroxide solution and washed with water. Thereafter, toluene was distilled out by means of an evaporator while replacing it with 118.1 parts of diethylene glycol monoethyl ether acetate to obtain a novolak type acrylate resin solution.

Next, 332.5 parts of the resultant novolak type acrylate resin solution and 1.22 parts of triphenylphosphine were charged into a reaction vessel equipped with a stirrer, a thermometer and an air blowing tube. 60.8 parts of tetrahydrophthalic anhydride was gradually added to the mixture while stirring and blowing air thereinto at the rate of 10 ml/minute and left reacting for 6 hours at 95-101° C. The product was cooled and then extracted from the vessel. The solution of the carboxyl group-containing photosensitive resin (hereinafter abbreviated as "A-1") consequently obtained was found to have a nonvolatile content of 65% and an acid value of 87.7 mg KOH/g as solids.

SYNTHESIS EXAMPLE 2

In a four-necked flask equipped with a gas introduction tube, a stirrer, a cooling tube, and a thermometer, 330 g of a cresol novolak type epoxy resin (EPICLON N-695 manufactured by DIC Corporation, epoxy equivalent; 220) and 340 g of carbitol acetate added thereto were dissolved by heating. Then, 0.46 g of hydroquinone and 1.38 g of triphenylphosphine were added to the solution. The resultant mixture kept heated to 95-105° C. and 108 g of acrylic acid gradually added dropwise thereto were left reacting for 16 hours. The reaction product was cooled to 80-90° C. and made to add 68 g of tetrahydrophthalic anhydride, and they were left reacting for 8 hours and then cooled. The solution of the carboxyl group-containing photosensitive resin (hereinafter abbreviated as "A-4") consequently obtained was found to have an acid value of 50 mg KOH/g as solids and a nonvolatile content of 60%.

PHOTOCURABLE AND THERMOSETTING RESIN COMPOSITION EXAMPLES 1 to 14

By using the resin solutions obtained in the synthesis examples mentioned above, the components shown in Table 1 accounting for varying ratios (in parts by weight) of combination shown in Table 1 were compounded, preliminarily mixed with an stirrer, and then kneaded with a three-roll mill to obtain photocurable and thermosetting resin compositions for a solder resist.

TABLE 1

| Composition (parts by weight) | Photocurable and Thermosetting Resin Composition Examples | | | | | | | | | | | | | |
|---|---|---|---|---|---|---|---|---|---|---|---|---|---|---|
| | 1 | 2 | 3 | 4 | 5 | 6 | 7 | 8 | 9 | 10 | 11 | 12 | 13 | 14 |
| A-1 | 154 | 154 | | | | 154 | 154 | | 154 | 154 | | 154 | 154 | 154 |
| A-2 *[1] | | | 154 | | | | | 154 | | | | | | |
| A-3 *[2] | | | | 154 | | | | | | | 154 | | | |
| A-4 | | | | | 167 | | | | | | | | | |
| OXE-02 *[3] | | | | | | | 1 | 1 | 1 | 1 | 1 | 1 | 1 | 1 |
| NCI-831 *[4] | 1 | 1 | 1 | 1 | 1 | 1 | | | | | | | | |
| TPO *[5] | 5 | 5 | 5 | 5 | 5 | 5 | 5 | 5 | 5 | 5 | 5 | 5 | 5 | 5 |
| Talc *[6] Refractive index: 1.57 | | 10 | | | | | 300 | 270 | 150 | | 150 | | 20 | |
| Barium sulphate *[7] Refractive index: 1.64 | | 70 | 100 | | | | | | | 50 | 100 | | | |
| Aluminum hydroxide *[8] Refractive index: 1.57 | | | | | | | | | | | | | 100 | |
| Magnesium hydroxide *[9] Refractive index: 1.58 | | | | | | | | | | | | | | 100 |
| Boehmite *[10] Refractive index: 1.62 | | | | 20 | | | | | | | | | | |

TABLE 1-continued

| Composition (parts by weight) | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| Silica *11 Refractive index: 1.45 | | 30 | | 50 | | | | 30 | 50 | | | | 30 | |
| AKTIZIL AM *12 Refractive index: 1.55 | 230 | | | | | 500 | | | 50 | 250 | 200 | 300 | 150 | 200 |
| Hydrotalcite *13 Refractive index: 1.50 | 10 | 10 | 10 | 10 | 10 | 10 | 10 | 10 | 10 | 10 | 10 | 10 | 5 | 5 |
| PB3600 *14 | | | | | | | | | | | | | 10 | 50 |
| Accel M *15 | 0.1 | 0.1 | 0.1 | 0.1 | 0.1 | 0.1 | 0.1 | 0.1 | 0.1 | 0.1 | 0.1 | 0.1 | 0.1 | 0.1 |
| Zisnet F *16 | 0.1 | 0.1 | 0.1 | 0.1 | 0.1 | 0.1 | 0.1 | 0.1 | 0.1 | 0.1 | 0.1 | 0.1 | 0.1 | |
| Karenz MTBD1 *17 | | | | | | | | | | | | | | 0.1 |
| YX-4000 *18 | 20 | 20 | 20 | 20 | 20 | 20 | 20 | 20 | 20 | 20 | 20 | 20 | 20 | |
| YSLV-80XY *19 | 20 | 20 | 20 | 20 | 20 | 20 | 20 | 20 | 20 | 20 | 20 | 20 | 10 | |
| Melamine | 5 | 5 | 5 | 5 | 5 | 5 | 5 | 5 | 5 | 5 | 5 | 5 | 3 | 3 |
| IRGANOX 1010 *20 | | 2 | 2 | 2 | 2 | 2 | 2 | 2 | 2 | 2 | 2 | 2 | 1 | 2 |
| TPA-B80E *21 | 2 | | | | | | | | | | | | | |
| Blue pigment *22 | 0.5 | 0.5 | 0.5 | 0.5 | 0.5 | 0.5 | 0.5 | 0.5 | 0.5 | 0.5 | 0.5 | 0.5 | 0.5 | 0.5 |
| Yellow pigment *23 | 0.5 | 0.5 | 0.5 | 0.5 | 0.5 | 0.5 | 0.5 | 0.5 | 0.5 | 0.5 | 0.5 | 0.5 | 0.5 | 0.5 |
| DPHA *24 | 15 | 15 | 15 | 15 | 15 | 15 | 15 | 15 | 15 | 15 | 15 | 15 | 15 | 15 |
| A-DCP *25 | 5 | 5 | 5 | 5 | 5 | 5 | 5 | 5 | 5 | 5 | 5 | 5 | 5 | 5 |
| Filler content based on total amount of nonvolatile content (% by volume) | 35.3 | 19.5 | 17.6 | 15.4 | 3.7 | 53.3 | 40.3 | 41.1 | 40.5 | 42.1 | 44.4 | 41.2 | 42.2 | 40.1 |
| Linear thermal expansion coefficient (ppm) | 35 | 45 | 50 | 55 | 60 | 19 | 15 | 20 | 25 | 30 | 25 | 30 | 30 | 30 |

Respective meanings of the reference numerals described in Table 1 are as follows:
*1 ZFR-1401H (manufactured by Nippon Kayaku Co., Ltd., nonvolatile content: 65.0%, acid value as solids: 100 mgKOH/g)
*2 ZCR-1601H (manufactured by Nippon Kayaku Co., Ltd., nonvolatile content: 65.0%, acid value as solids: 100 mgKOH/g)
*3 Ethanone, 1-[9-ethyl-6-(2-methylbenzoyl)-9H-carbazole-3-yl]-1,1-(O-acetyloxime) (manufactured by Chiba Japan Ltd.)
*4 ADEKA ARKLS NCI-831 (manufactured by ADEKA CORPORATION)
*5 LUCIRIN TPO (manufactured by BASF Corporation)
*6 K-1 manufactured by NIPPON TALC Co., Ltd. (refractive index: 1.57)
*7 B-33 manufactured by Sakai Chemical Industry Co., Ltd. (refractive index: 1.64)
*8 HIGILITE H-42M manufactured by Showa Denko K.K. (refractive index: 1.57)
*9 MGZ-3 manufactured by Sakai Chemical Industry Co., Ltd. (refractive index: 1.58)
*10 ACTILOX400SM manufactured by Nabaltec GmbH (refractive index: 1.62)
*11 SO-E2 manufactured by Admatechs Company Limited (refractive index: 1.45)
*12 Manufactured by HOFFMANN MINERAL GmbH (refractive index: 1.55) (Sillitin, which is a compound comprising spherical silica and lamellar kaolinite, treated with an amino silane coupling agent)
*13 DHT-4A manufactured by Kyowa Chemical Industry Co., Ltd. (refractive index: 1.50)
*14 Epoxidized polybutadiene (manufactured by Daicel Corporation, molecular weight: 3000, epoxy equivalent: 200)
*15 2-mercaptobenzothiazole (manufactured by Kawaguchi Chemical Industry Co., Ltd.)
*16 2,4,6-trimercapto-s-triazine (manufactured by SANKYO KASEI Co., Ltd.)
*17 1,4-bis(3-mercapto butyryloxy)butane (manufactured by Showa Denko K.K.)
*18 Bixylenol type epoxy resin (manufactured by Japan Epoxy Resin K.K.)
*19 Bisphenol type epoxy resin (manufactured by Tohto Kasei Co., Ltd.)
*20 Antioxidant (manufactured by Chiba Japan Ltd.)
*21 Blocked isocyanate (manufactured in Asahi Chemical Industries Co., Ltd.)
*22 C.I. Pigment Blue 15:3
*23 C.I. Pigment Yellow 147
*24 Dipentaerythritol hexaacrylate (manufactured by Nippon Kayaku Co., Ltd.)
*25 Tricyclodecane dimethanol diacrylate (manufactured by Shin-Nakamura Chemical Co., Ltd.)

Linear Thermal Expansion Coefficient:

A cured film having the size of 3 mm×10 mm was subjected to a tensile test in TMA6100 manufactured by Seiko Instrument Co., Ltd. with a fixed heating rate at a temperature range of 0° C. to 260° C. while applying 10 g of load to the film. The linear thermal expansion coefficient was calculated from the degree of elongation of the cured film in relation to temperature.

Preparation of Photosensitive Dry Films:

EXAMPLES 1 to 13

By using the compositions of the above-mentioned photocurable and thermosetting resin composition examples 1-14, the photosensitive dry films having a pattern-formable photosensitive resin layer of the two-layer structure were produced by forming the first photosensitive resin layer (L1) of 10 μm thickness contacting a substrate and the second photosensitive resin layer (L2) of 10 μm thickness contacting this first photosensitive resin layer (L1) in the combination shown in Table 2. Incidentally, the photosensitive dry film was prepared by applying the composition for the above-mentioned L2 layer on a polyester film of 38 μm thickness as a carrier film by the use of an applicator to obtain the L2 layer of 10 μm thickness after drying the composition at 80° C. for 20 minutes, then applying the composition for the L1 layer on the L2 layer by the use of an applicator to obtain the L1 layer of 10 μm thickness after drying the composition at 80° C. for 20 minutes, and left cooling to a room temperature.

TABLE 2

| Photocurable and Thermosetting Resin Composition Examples | Examples | | | | | | | | | | | | |
|---|---|---|---|---|---|---|---|---|---|---|---|---|---|
| | 1 | 2 | 3 | 4 | 5 | 6 | 7 | 8 | 9 | 10 | 11 | 12 | 13 |
| 1 | L1 | | | | | L1 | | | | | | | |
| 2 | | L1 | | | | | L1 | L1 | L1 | L1 | L1 | L1 | L1 |
| 3 | | | L1 | | | | | | | | | | |
| 4 | | | | L1 | | | | | | | | | |
| 5 | | | | | L1 | | | | | | | | |
| 6 | | | | | | L2 | | | | | | | |
| 7 | | | | | | | L2 | | | | | | |
| 8 | | | | | | | | L2 | | | | | |
| 9 | | | | | | | | | L2 | | | | |
| 10 | | | | | | | | | | L2 | | | |
| 11 | | | | | | | | | | | L2 | | |
| 12 | L2 | L2 | L2 | L2 | L2 | | | | | | | | |
| 13 | | | | | | | | | | | | L2 | |
| 14 | | | | | | | | | | | | | L2 |

COMPARATIVE EXAMPLES 1 to 3

By using the compositions of the above-mentioned photocurable and thermosetting resin composition examples 4 and 8, the photosensitive dry films having a pattern-formable photosensitive resin layer of the two-layer structure were produced in the same manner as in the Examples mentioned above by forming the first photosensitive resin layer (L1) of 10 μm thickness contacting a substrate and the second photosensitive resin layer (L2) of 10 μm thickness contacting this first photosensitive resin layer (L1) in the combination shown in Table 3. Incidentally, in the case of Comparative Examples 2 and 3, only the first photosensitive resin layer (L1) contacting a substrate was formed so as to have the thickness of 20 μm by the use of the composition of the above-mentioned photocurable and thermosetting resin composition example 4 or 8.

TABLE 3

| Photocurable and Thermosetting Resin Composition Examples | Comparative Examples | | |
|---|---|---|---|
| | 1 | 2 | 3 |
| 4 | L2 | | L1 |
| 8 | L1 | L1 | |

Evaluation of Characteristics:

Single side printed wiring boards having a circuit pattern of copper of 15 μm thickness formed in advance thereon were subjected to a pretreatment by the use of CZ8100 produced by MEC COMPANY LTD. By using the photosensitive dry films of Examples and Comparative Examples mentioned above, the test boards were prepared so as to have a resin insulation layer of the two-layer structure in such a way that the L1 layer and the L2 layer are formed on the board mentioned above in this order by laminating them on the board by the use of a vacuum laminator so that the L1 layer is in contact with the board. Each board was exposed to light according to a solder resist pattern with the optimum exposure dose by the use of an exposure device equipped with high-pressure mercury vapor lamps, and, after separation of the carrier film, developed for 90 seconds with an aqueous 1 wt. % sodium carbonate solution of 30° C. under a spraying pressure of 0.2 MPa to obtain a resist pattern. The resist layer on this board was cured by exposing to UV light under the conditions of accumulated exposure dose of 1,000 mJ/cm$^2$ by the use of a UV conveyor furnace and then heating at 160° C. for 60 minutes. The characteristics of the obtained printed board (test board) were evaluated in the following manner.

<Resistance to Soldering Heat>

The test board coated with a rosin-based flux was repeatedly immersed in a solder bath previously set at 260° C., and visually examined as to the blister or separation of the resist layer after washing the flux with a denatured alcohol. The criterion for evaluation is as follows:

◯◯: Separation of the resist layer is not found even when the immersion for 10 seconds is repeated six times or more.

◯: Separation of the resist layer is not found even when the immersion for 10 seconds is repeated three times or more.

Δ: Slight separation of the resist layer is found when the immersion for 10 seconds is repeated three times or more.

×: Blister and separation of the resist layer are found until the immersion for 10 seconds is repeated three times.

<Resistance to Electroless Gold Plating>

Each test board was plated successively in an electroless nickel plating bath and an electroless gold plating bath, both available in the market, under the conditions of 0.5 μm of nickel and 0.03 μm of gold. Then, the plated test board was examined to determine whether or not the resist layer was separated and whether or not the resist layer was infiltrated with a plating solution. Thereafter, the test board was subjected to a peeling test with an adhesive tape to evaluate the separation of the resist layer. The criterion for evaluation is as follows:

◯◯: Infiltration with the plating solution and separation of the resist layer are not observed.

◯: Slight Infiltration with the plating solution is observed after plating, but no separation of the resist layer is observed after the tape peeling test.

Δ: Slight Infiltration with the plating solution is observed after plating, and separation of the resist layer is also observed after the tape peeling test.

×: Separation of the resist layer is observed after plating.

<PCT Resistance>

The test board which has been undergone the electroless gold plating as mentioned above was placed in a high-pressure, high-temperature and high-humidity chamber kept at 121° C., two atmospheric pressure and humidity of 100% and left standing for 300 hours therein. Thereafter, a change in the state of the cured film was evaluated on the following criterion.

○○: No conspicuous blister or discoloration of the cured film is observed.

○: No conspicuous separation of the cured film is observed. Partial blister or discoloration of the cured film is observed.

×: Conspicuous blister and discoloration of the cured film is observed.

<Resistance to Cracking>

The test board which has been undergone the electroless gold plating as mentioned above was subjected to the heat cycle test under the conditions of 2,000 cycles between −65° C.×30 minutes and 150° C.×30 minutes. After completion of this test, the state of the cured film was observed through a light microscope.

○○: No occurrence of cracks is observed.

Δ: Occurrence of cracks is observed.

×: Occurrence of cracks is remarkable.

<Resolution>

A negative pattern having via holes 80 μm in diameter was used as a negative mask for evaluation of resolution. The bottom diameters of openings of the resultant solder resist were observed and measured through a scanning electron microscope (SEM) of 1000× magnification and evaluated on the following criterion.

○○: The bottom diameters are in the range of 70-80 μm.

○: The bottom diameters are not less than 50 μm and less than 70 μm.

×: The bottom diameters are less than 50 μm.

<Peel Strength>

In the test board preparation step mentioned above, a copper foil of 18 μm thickness was used in place of the single side printed wiring board and the copper foil was likewise subjected to a pretreatment by the use of CZ8100. By using the photosensitive dry films of Examples and Comparative Examples mentioned above, each of the test board was similarly prepared by laminating the L1 layer and the L2 layer on the pretreated surface of the copper foil, respectively. A two-part epoxy adhesive (ARALDITE) was applied to the insulation-layer side of the resultant test board, and it was turned over, laminated on a FR-4 substrate of which copper of 1.6 mm thickness etched overall, and cured. After curing, the test was carried out by cutting the copper foil adhered to the insulation layer by 1-cm width and peeling at an angle of 90 degree, and its peel strength was measured with a peel gauge.

○○: Not less than 6 N.

Δ: Not less than 3 N and less than 6 N.

×: Less than 3 N.

The results of respective tests mentioned above are collectively shown in Tables 4.

COMPARATIVE EXAMPLE 4

A monolayer film was prepared in the same way as in Comparative Example 2 by the use of the composition example 7 except that talc was wholly changed to spherical silica. It exhibited the results that the resolution was also × in addition to the resistance to electroless gold plating of Δ and the PCT resistance of ×.

As shown in Table 4 mentioned above, in Examples in which the first photosensitive resin layer (L1) contacting a substrate was prepared from the photocurable and thermosetting resin composition examples 1-5 of which inorganic filler content is less than 38% by volume and the second photosensitive resin layer (L2) contacting the above-mentioned first photosensitive resin layer (L1) was prepared from the photocurable and thermosetting resin composition examples 6-14 of which inorganic filler content falls in the range of 38-60% volume, there was no problem in all the resistance to soldering heat, the resistance to electroless gold plating, the PCT resistance, the resistance to cracking, and the resolution. On the contrary, in the case of Comparative Example 1 in which the first photosensitive resin layer (L1) contacting a substrate was prepared from the photocurable and thermosetting resin composition example 8 of which inorganic filler content falls in the range of 38-60% volume and the second photosensitive resin layer (L2) contacting the above-mentioned first photosensitive resin layer (L1) was prepared from the photocurable and thermosetting resin composition example 4 of which inorganic filler content is less than 38% by volume, the adhesiveness to the substrate was bad and the PCT resistance was poor. On the other hand, in the case of Comparative Example 2 in which only the first photosensitive resin layer (L1) contacting a substrate was prepared by the use of the photocurable and thermosetting resin composition example 8 of which inorganic filler content falls in the range of 38-60% volume, it was inferior in the PCT resistance and also in the resistance to electroless gold plating. In the case of Comparative Example 3 in which only the first photosensitive resin layer (L1) contacting a substrate was prepared by the use of the photocurable and thermosetting resin composition example 4 of which inorganic filler content is less than 38% volume, it has been confirmed that there was no problem but somewhat inferior in the PCT resistance and the resistance to electroless gold plating. Further, a linear thermal expansion coefficient was high, and there was a problem in the resistance to cracking.

Further, in case the monolayer film was prepared in the same way as in Comparative Example 2 by the use of the photocurable and thermosetting resin composition example 7 of which inorganic filler content is not less than 38% volume

TABLE 4

| Characteristics | Examples | | | | | | | | | | | | | Comp. Examples | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 1 | 2 | 3 |
| Resistance to soldering heat | ○○ | ○○ | ○○ | ○○ | ○○ | ○○ | ○○ | ○○ | ○○ | ○○ | ○○ | ○○ | ○○ | ○○ | ○○ | ○ |
| Resistance to electroless gold plating | ○○ | ○○ | ○○ | ○○ | ○ | ○○ | ○○ | ○○ | ○○ | ○○ | ○○ | ○○ | ○○ | ○ | Δ | ○ |
| Resistance to PCT | ○○ | ○○ | ○○ | ○○ | ○○ | ○○ | ○○ | ○○ | ○○ | ○○ | ○○ | ○○ | ○○ | × | × | ○ |
| Resistance to cracking | ○○ | ○○ | ○○ | ○○ | ○○ | ○○ | ○○ | ○○ | ○○ | ○○ | ○○ | ○○ | ○○ | ○○ | ○○ | Δ |
| Resolution | ○○ | ○○ | ○○ | ○ | ○○ | ○○ | ○○ | ○○ | ○○ | ○ | ○○ | ○○ | ○○ | ○○ | ○○ | ○ |
| Peel strength | ○○ | ○○ | ○○ | ○○ | ○○ | ○○ | ○○ | ○○ | ○○ | ○○ | ○○ | ○○ | ○○ | × | × | ○○ | except that talc was wholly changed to spherical silica, it exhibited inferior resistance to electroless gold plating and inferior PCT resistance and further the bad resolution.

Industrial Applicability:

The present invention is advantageously applicable to a layered structure, such as a printed wiring board, and the photosensitive dry film of the present invention can be advantageously used as a solder resist, an interlayer resin insulation layer, or the like for a printed wiring board.

The International Application PCT/JP2011/052001, filed Feb. 1, 2011, describes the invention described hereinabove and claimed in the claims appended hereinbelow, the disclosure of which is incorporated here by reference.

What is claimed is:

1. A photosensitive dry film, comprising:
a photosensitive resin layer which is to be adhered to a member for adhesion and capable of forming a pattern, the photosensitive resin layer including an inorganic filler,
wherein the photosensitive resin layer comprises a plurality of layers having different contents of the inorganic filler, said photosensitive resin layer on a side to be adhered to the member for adhesion includes the inorganic filler at a lower content than the photosensitive resin layer on a surface side away from said member for adhesion, the content of the inorganic filler in the photosensitive resin layer on the side to be adhered to the member for adhesion is less than 38% by volume of a total amount of nonvolatile content, the content of the inorganic filler in the photosensitive resin layer on the side away from the member for adhesion is in a range of from 38% to 60% by volume of the total amount of nonvolatile content, and the inorganic filler in the photosensitive resin layer on the side away from the member for adhesion comprises at least one of Mg and Al.

2. The photosensitive dry film according to claim 1, wherein the content of the inorganic filler in said photosensitive resin layer gradually increases continuously obliquely, or stepwise, from the side to be adhered to the member for adhesion to the surface side away from said member for adhesion.

3. The photosensitive dry film according to claim 1, wherein a kind of the inorganic filler or a combination of at least two kinds of inorganic fillers contained in said photosensitive resin layer is different between the side to be adhered to said member for adhesion and the surface side away from said member for adhesion.

4. The photosensitive dry film according to claim 1, wherein the inorganic filler in the photosensitive resin layer on the side away from the member for adhesion comprises Mg and Al.

* * * * *